United States Patent [19]
Asaumi et al.

[11] Patent Number: 5,315,137
[45] Date of Patent: May 24, 1994

[54] CHARGE TRANSFER DEVICE, PROCESS FOR ITS MANUFACTURE, AND METHOD OF DRIVING THE DEVICE

[75] Inventors: Masaji Asaumi, Kyouto; Takao Kuroda, Ibaraki, both of Japan

[73] Assignee: Matsushita Electronics Corporation, Kadoma, Japan

[21] Appl. No.: 790,782

[22] Filed: Nov. 12, 1991

[30] Foreign Application Priority Data

Nov. 9, 1990 [JP] Japan ............... 2-304732

[51] Int. Cl.$^5$ .......................... H01L 29/796
[52] U.S. Cl. ...................... 257/221; 257/246; 257/248; 257/250
[58] Field of Search ............ 357/24; 257/221, 246–248

[56] References Cited

U.S. PATENT DOCUMENTS

| | | | |
|---|---|---|---|
| 3,796,932 | 3/1974 | Amelio et al. | 357/24 M |
| 4,691,218 | 9/1987 | Boudewijns | 357/24 M |
| 4,910,569 | 3/1990 | Erhardt | 357/24 M |
| 4,992,842 | 2/1991 | Yang et al. | 357/24 M |
| 5,065,203 | 11/1991 | Yang et al. | 357/24 M |

*Primary Examiner*—Gene M. Munson
*Attorney, Agent, or Firm*—Ratner & Prestia

[57] ABSTRACT

The present invention relates to a charge transfer device having high transfer efficiency without leaving over signal charges, a charge transfer device substantially shortened in the gate length so as to enhance the transfer speed, and a method of manufacturing and a method of driving such device. In the charge transfer device of the invention, the n$^-$ diffusion layer is formed on the semiconductor substrate. In the surface region of the n$^-$ diffusion layer, a plurality of n diffusion layers are formed at equal intervals. The interval of the adjacent n diffusion layers is about 5 to 10 $\mu$m. On the n$^-$ diffusion layer, an insulation film is formed. On the insulation film, transfer electrodes having two different shapes are formed. The transfer electrodes of these two types are alternately arranged. These transfer electrodes differ in length. The length of the longer transfer electrodes is about twice the length of the shorter transfer electrodes. Furthermore, the right end of the n diffusion layer nearly coincides with the right end of the longer transfer electrodes formed on the gate oxide film in the spatial position.

6 Claims, 12 Drawing Sheets

CHARGE TRANSFER DEVICE, PROCESS FOR ITS MANUFACTURE, AND METHOD OF DRIVING THE DEVICE

BACKGROUND OF THE INVENTION

1. Field of the Invention

The present invention relates to a charge transfer device, a process for manufacturing the device, and a method of driving the device.

2. Description of the Prior Art

A solid-state image sensor represented by a charge-coupled device (hereinafter "CCD") is excellent in low-noise characteristics and other properties, and is hence put in practical use intensively.

Referring first to the drawings, the structure and driving method of the charge transfer device used in the conventional solid-state image sensor is described below.

In FIGS. 15 to 18, the structure and driving method of the so-called four-phase driven charge transfer device is shown as a conventional example of a charge transfer device.

FIG. 15 describes the structure of the device. Numeral 1 denotes a p-type semiconductor substrate, 2 is an n⁻ diffusion layer to be used as the channel portion of a so-called buried type channel CCD, 3 to 6 are transfer electrodes, 7 is an insulation layer of SiO₂ or the like, and 8 to 11 are voltage application terminals to each transfer electrode.

FIG. 16 shows driving voltage waveforms, in which φ1 to φ4 are voltage waveforms to be applied to voltage application terminals 8 to 11, respectively. In the driving waveforms, the state of the voltage higher than zero volts is called H (high) state, and the state of the voltage lower than zero volts is called L (low) state.

FIG. 17 depicts the potential distribution of the channel portion 2 at time t1 to t5.

Regions A2 to F2 correspond to regions A1 to F1 shown in FIG. 15, and numerals 16, 17 are transfer charges.

As shown in FIG. 16, at t=t1, a high voltage (hereinafter indicated as "H") is applied to the voltage application terminals 8, 9. At the voltage application terminals 10, 11, a low voltage ("L") is applied. A voltage of H level is applied to the transfer electrodes 3, 4, and L level to the transfer electrodes 5, 6.

As shown in FIG. 17, the potential of the transfer channel corresponding to the electrode of H level becomes high (hereinafter called "potential well"). In this potential well, the electrons of the signal charges 16, 17 are stored.

Next, at t=t2, the voltage application terminal 10, that is, the transfer electrode 5 changes from L to H. As a result, the signal charges 16, 17 are stored in the potential well of the channel coupled to the transfer electrodes 3, 4.

At t=t3, the voltage application terminal 8, that is, the transfer electrode 3 is changed from H to L. Consequently, the potential well formed beneath the transfer electrode 3 is eliminated. The charges staying there move to the potential well beneath the transfer electrodes 4, 5.

By this sequence of operations, the charges 16, 17 are moved by the distance of one transfer electrode.

Thereafter, repeating the same operation, the charges are sequentially transferred. Thus, in the charge transfer device, the signal charges must be transferred to the next potential well exactly within a specified time.

FIG. 18 shows the transient state of moving from t=t4 to t=t5 in FIG. 17, in which numeral 21 denotes the potential distribution at t=t4, 24 is the signal charges at this time, 22 is the potential distribution at the transient time, 25 is the charges at this time, 23 is the potential distribution at t=t5, and 20 expresses the movement of charges.

As the voltage applied to the transfer electrode 4 changes from H to L, the channel portion coupled to the transfer electrode 4 changes from the state of potential 21 to the state of potential 23. At this time, the charges 24, which comprise a majority of the charges coupled to the transfer electrode 4, are moved to the potential well beneath the next transfer electrode 5 by the repulsive force between charges. However, slight charges 25 are left over. It is the force from the diffusion and fringe electric force that moves these charges 25 into the potential well beneath the next transfer electrode 5. By the end of the move of the charges 25, the transfer is terminated.

In the constitution of the conventional charge transfer device as stated above, the following defects were involved.

That is, in the conventional charge transfer device, since the length of the adjacent transfer electrodes is equal, charges are often left over, and the transfer efficiency is poor.

There is only one diffusion layer beneath the transfer electrodes, and when transferring the charges stored in the diffusion layer, they are left over.

Besides, because of only one diffusion layer beneath the transfer electrodes, the channel potential difference is needed as much as the drive pulse voltage, and the control performance is poor.

Since only one diffusion layer is disposed beneath the transfer electrodes, the effective gate length cannot be shortened in order to heighten the transfer speed.

In the conventional charge transfer device, since the length of the adjacent transfer electrodes is equal, the transfer speed of the charge transfer device cannot be quickened.

Thus, in the conventional charge transfer device, although all charges must be transferred within a limited time, some charges are sometimes left over, and 100% transfer efficiency is not achieved. The remaining charges appear as a blurring of the image in the image sensor, and the picture quality is degraded.

In the light of the above demerits, it is hence a primary object of the invention to present a charge transfer device of high transfer efficiency with less left-over charges, a process for manufacturing the device, and a method of driving the device.

It is another object of the invention to present a charge transfer device of which channel potential difference is about half the drive pulse voltage, a method for manufacturing the device, and a method of driving the device.

It is another object of the invention to present a charge transfer device shortened in the effective gate length so as to increase the transfer speed, a method for manufacturing the device, and a method of driving the device.

It is a further object of the invention to present a charge transfer device capable of enhancing the picture quality by transferring almost all charges within a limited time, while preventing blurring of image on an image sensor, a method for manufacturing the device, and a method of driving the device.

SUMMARY OF THE INVENTION

A charge transfer device of the invention is capable of remarkably reducing the charges left-over, and achieving a high transfer efficiency, by setting the length of the longer transfer electrodes longer than the length of the shorter transfer electrodes.

Besides, by forming the impurity concentration of two diffusion layers beneath the longer transfer electrodes in a specific relation, the channel potential difference may be set to about half the drive pulse voltage.

By applying a reverse bias voltage so that the diffusion layer may be positive between one diffusion layer of two diffusion layers beneath the longer transfer electrodes and the semiconductor substrate, both diffusion layers formed beneath the longer transfer electrodes may be set in a depletion state.

By coinciding one end of one diffusion layer beneath the longer transfer electrode with one end of the longer transfer electrode, the effective gate length may be shortened.

By setting the length of the longer transfer electrodes longer than that of the shorter transfer electrodes, the transfer speed of the charge transfer device may be quickened.

When the length of the longer transfer electrodes is 1.6 times or more of that of the shorter transfer electrodes, the charge may be transferred in a shorter transfer time than in the conventional charge transfer device.

When the length of the longer transfer electrodes is 4 times or less of that of the shorter transfer electrodes, the time required for transfer by the charge transfer device of an embodiment of the invention is shorter than in the prior art.

When the length of the longer transfer electrode is in the range of 1.0 times to 1.6 times of the length of the shorter transfer electrode, the time required for transfer by the charge transfer device of an embodiment of the invention is shorter than the conventional time.

In the charge transfer device of two-phase drive, when the length of the longer transfer electrodes is 2 times the shorter transfer electrode, if the length of the n− diffusion layer is in a range of 10% to 90% of the length of the longer transfer electrodes, priority is kept over the conventional structure in the charge transfer time.

Besides, when the length of the n− diffusion layer just beneath the longer transfer electrodes is equal to that of the n diffusion layer, if the length of the longer transfer electrodes is 0.61 times or more of the length of the shorter transfer electrodes, the transfer time may be shorter than in the charge transfer device of the conventional structure.

BRIEF DESCRIPTION OF THE DRAWINGS

FIG. 12 FIGS. 12(a) through 12(d) are process sequence sectional views showing the manufacturing method of a charge transfer device in a fifth embodiment of the invention.

FIG. 13 FIGS. 13(a) through 13(d) are process sequence sectional views showing the manufacturing method of a charge transfer device in a sixth embodiment of the invention.

FIG. 14 FIGS. 14(a) through 14(e) are process sequence sectional views showing the manufacturing method of a charge transfer device in a seventh embodiment of the invention.

DESCRIPTION OF THE PREFERRED EMBODIMENTS

Figure 1:
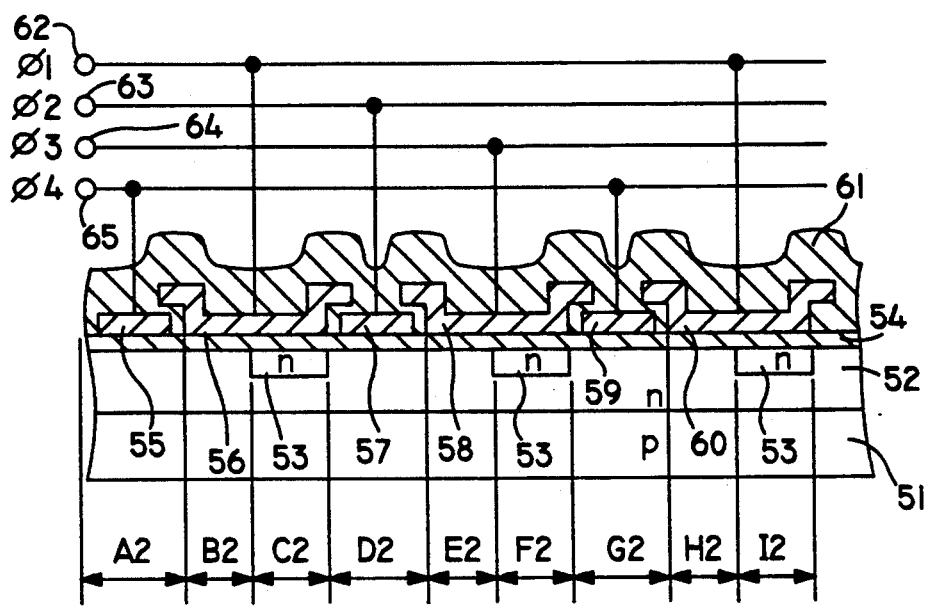
FIG. 1 is a sectional view of a charge transfer device in a first embodiment of the invention.

Referring now to the drawings, some of the embodiments of the invention are described in detail below.

Figure 2:
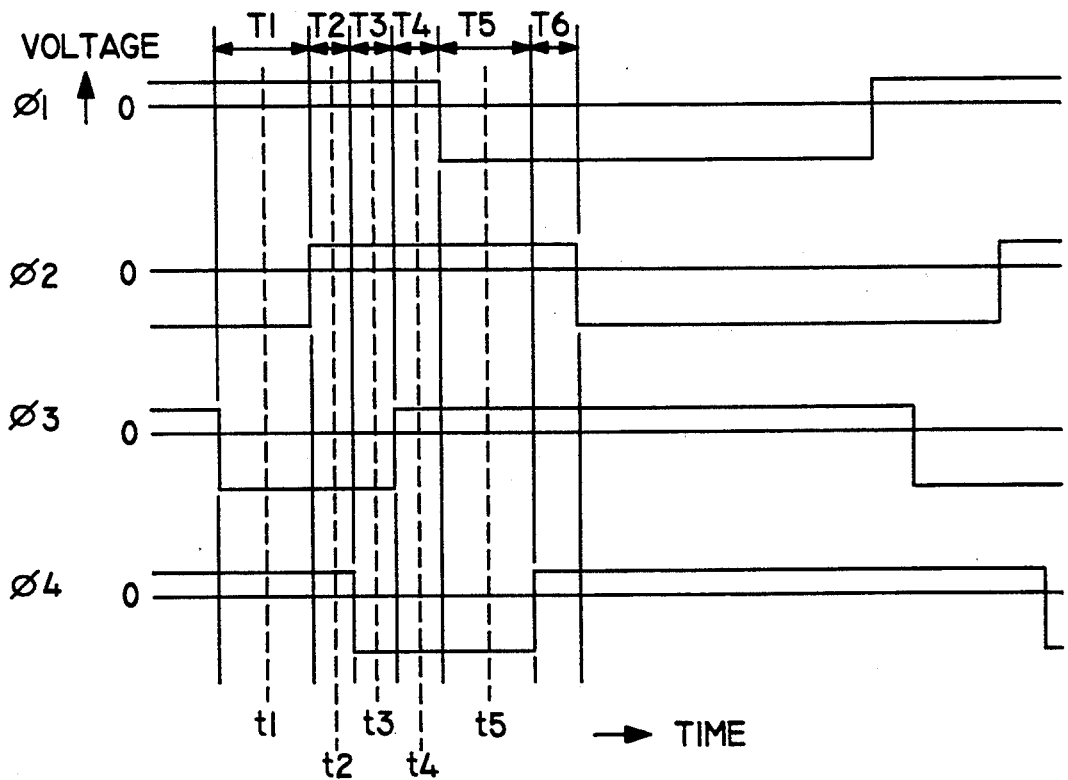
FIG. 2 is a diagram showing the state of applied voltage of a charge transfer device in the first embodiment of the invention.
Figure 3:
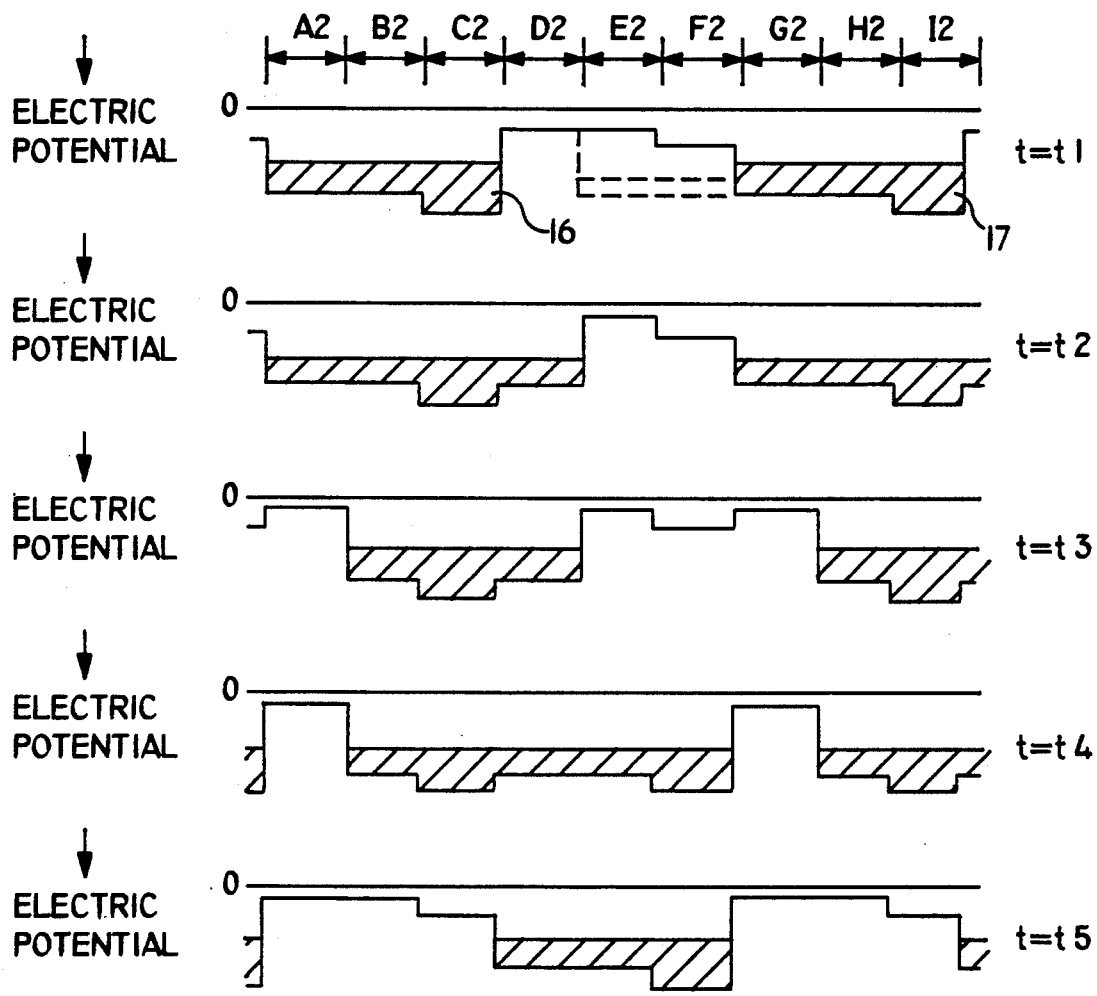
FIG. 3 is a diagram showing the state of signal charge of a charge transfer device in the first embodiment of the invention.

FIGS. 1 to 3 show a charge transfer device in a first embodiment of the invention and its driving method. FIG. 1 is a sectional view of a charge transfer device of the invention.

In the diagram, regions A2, B2, C2, D2, E2, F2, G2, H2, I2 respectively represent the regions corresponding to the transfer electrodes and diffusion layers.

In a semiconductor substrate 51 which is a p-type silicon wafer, an n− diffusion layer 52 with a depth of about 0.5 $\mu$m is formed. The impurity concentration of the n− diffusion layer 52 is about $6 \times 10^{16}/cm^3$. This value of impurity concentration is determined in relation to the voltage applied to transfer electrodes 55 to 60, and the maximum charge that can be handled in the diffusion layer at that impurity concentration, as mentioned later. The depth of the n− diffusion layer 52 may be set to such a depth that the charges may not reach the interface of the silicon and $SiO_2$ on the semiconductor substrate 51 when reaching the maximum charges that can be handled.

In the surface region of the n− diffusion layer 52, a plurality of n diffusion layers 53 are formed at equal intervals. The interval of adjacent n diffusion layers 53 is about 5 to 10 $\mu$m. The depth of the n diffusion layer 53 is about 0.5 $\mu$m. The impurity concentration of the n diffusion layer 53 is about $7 \times 10^{16}/cm^3$. The depth of the n diffusion layer 53 is set to such an extent that the charges that can be handled as desired may not be influenced by the interface level of the silicon and $SiO_2$, as in the n− diffusion layer 52. The impurity concentration of the n diffusion layer 53 is set so that the channel potential may be about half the drive pulse voltage higher in the n diffusion layer 53 than in the n− diffusion layer 52, when the diffusion layer is completely depleted by applying a positive voltage to the n− diffusion layer 52 and the n diffusion layer 53. Meanwhile, the n− diffusion layer 52 and the n diffusion layer 53 are so-called buried channel regions.

On the semiconductor substrate 51, an insulation film 54 made of $SiO_2$ or SiN or their laminate structure is formed. The insulation film 54 is formed beneath the transfer electrodes 55, 56, 57, 58, 59, 60 described below. The insulation film 54 functions as a gate insulation film for the transfer electrodes 55 to 60.

The transfer electrodes having two different shapes are formed on the insulation film 54. These transfer electrodes of two types are arranged alternately. That is, in the diagram, from left to right, the transfer electrode 55, the transfer electrode 56 at its side, the transfer electrode 57 at its side, the transfer electrode 58 at its side, and similarly the transfer electrodes 59, 60 are formed as shown in FIG. 1.

These transfer electrodes 55 to 60 are largely different in their length (the lateral direction on the sheet of paper). The length of the longer transfer electrodes 56, 58, 60 is formed about twice the length of the shorter transfer electrodes 55, 57, 59. Furthermore, the position of the right end of the n diffusion layer 53 nearly matches with that of the right end of the transfer electrodes 56, 58, 60 formed on the gate oxide film in the spatial position. The length of the n diffusion layer 53 (in the lateral direction on the sheet of paper) is formed to be about half the length of the transfer electrodes 56, 58, 60. When a voltage is applied to the charge transfer device in such a structure, a channel is formed (not shown) on the surface of the semiconductor substrate 51 just beneath the transfer electrodes 55 to 60. In this example, the channel is formed continuously on the surface of the semiconductor substrate 51. That is, channels are formed in three regions, that is, the n− diffusion layers 52 of the semiconductor substrate 51 just beneath the shorter transfer electrodes 55, 57, 59, the n− diffusion layer 52 of the semiconductor substrate 51 just beneath the longer transfer electrodes 56, 58, 60, and the n diffusion layers 53 formed just beneath the transfer electrodes 56, 58, 60. The length of each channel (the length in the lateral direction on the sheet of paper) is nearly equal.

The impurity concentration of the n diffusion layer 53 is higher than the impurity concentration of the n− diffusion layer 52.

The ratio of the impurity concentration of the n diffusion layer 53 and the n− diffusion layer 52 is set to be about 1.3 times. This value is an important figure for complete charge transfer (without leaving over anything) when transferring the charges stored in the diffusion layer. In other words, such impurity concentration ratio influences the driving voltage and driving frequency of the transfer electrodes. In order to transfer the charges completely, it is therefore desired to set the ratio of the impurity concentration of the n diffusion layer 53 and n− diffusion layer 52 at about 1.3 times so that the channel potential difference may be about half the driving pulse voltage.

As a result, so that the n− diffusion layer 52 may be positive, when a reverse bias voltage is applied between the n− diffusion layer 52 and the semiconductor substrate 51, the n diffusion layer 53 and the n− diffusion layer 52 formed on the semiconductor substrate 51 used as the buried channel region may be set in a depletion state. At this time, as to the potential of the channels formed in the n diffusion layer 53 and n− diffusion layer 52, the potential in the n diffusion layer 53 is higher than the potential in the n− diffusion layer 52. This is because the charge density of the n diffusion layer 53 increases in depletion state. Accordingly, the electric field intensity of the n diffusion layer 53 is heightened, and the potential also becomes higher. This may be also understood from the following equation.

$$\phi = -\alpha \frac{NA(NA + ND)}{ND} + \frac{NA + ND}{ND}(\beta + \tau NA + \delta N)$$

where NA is the impurity concentration of the semiconductor substrate 51, ND is the impurity concentration of the n diffusion layer 53, $\alpha$, $\beta$, $\tau$, and are proportional constants, and $\phi$ denotes the potential.

To quicken the transfer speed of the charge transfer device, the speed of transferring the charges in the potential well beneath a certain transfer electrode associated with the potential well of the next transfer electrode should be increased. However, quickening of this transfer speed, is limited by the diffusion and the intensity of the fringe electric field.

In this case, the diffusion refers to the phenomenon of movement of the charges from the high charge position to the low charge position, in the concentration distribution of charges. The potential well beneath the transfer electrode should be ideally changed in steps. However, due to the effects of the electric field generated by the adjacent transfer electrode, the potential does not change completely in steps. Rather, the potential changes smoothly. In this way, the electric field generated in a direction different from the electric field for transferring the charges initially is called the fringe electric field. Since this is an electric field in a direction different from the electric field initially generated in the transfer electrode, the field gives a large effect on the transfer speed.

Generally when transferring the entire charges only by diffusion, its transfer time is proportional to the square of the gate length beneath the transfer electrode. Similarly, when it is attempted to transfer the entire charges by fringe electric field only, its transfer time is proportional to the third power of the gate length. Summing up, to shorten the time required for transfer, the gate length should be short. In this embodiment, the effective gate length is shortened to about ⅔ times of the prior art by determining the spatial position so that the position of the right end of the n diffusion layers 53 may coincide with that of the right end of the longer transfer electrodes 56, 58, 60.

Thus, as compared with the conventional case, when the gate length is ⅔ times, the transfer speed is quicker by about 1.7 times.

As known herein, factors for limiting the transfer speed are diffusion and the intensity of the fringe electric field. In the case of a buried channel charge transfer device, the distance from the transfer electrode until the maximum point of the potential in the channel is as long as 0.5 μm, and therefore the effect of the fringe electric field is greater.

The conditions for quickening the transfer speed are explained below.

The length of the longer transfer electrodes 56, 58, 60 is supposed to be L1, the length of the n diffusion layers 53 to be L2 (L2<L1), and the length of the shorter transfer electrodes to be L3. At this time, it follows that L1+L3=L0, where L0 is a specific value, and also L1=nL3, where n is a positive real number.

Using these figures, the conventional structure may be expressed as L1=L3=L0/2, L2=0.

Considering only the fringe electric field, the time required for transfer is conventionally expressed as $(L0/2)^3 \times K$, where K is a proportional constant.

In the constitution of this embodiment, there are channels in a length of L1-L2 and L2 respectively under the longer transfer electrodes 56, 58, 60 or in the n$^-$ diffusion layer 52 and n diffusion layers 53. Accordingly, the time required for transferring the charges from the longer transfer electrode to the shorter transfer electrode is $[(L1-L2)^3 + L2^3] \times K$.

On the other hand, the time required for transferring from the shorter transfer electrode to the longer transfer electrode is $L3^3 \times K$.

Of these required transfer times, if the longer time is shorter than the time required for transferring in the conventional structure, the transfer speed will be faster than in the charge transfer device of the prior art.

For example, supposing a charge transfer device with L2=L1/2, in order to achieve $(L1-L2)^3 + L2^3 = L3^3$, it is known that n may be enough at about 1.6.

More specifically, L1−L2=L1/2, and this value is equal to $[n/2(n+1)] \times L0$, and L2 is also equal to L1/2, which is hence equal to this value. Accordingly, L3 is equal to $$[1/(n+1)] \times L0.$$

Therefore, if the longer transfer electrode is 1.6 times or more of the shorter transfer electrode, the time required for transferring from the longer transfer electrode to the shorter transfer electrode will be dominant.

Furthermore, the condition in which the time required for transferring from the longer transfer electrode to the shorter transfer electrode is shorter than in the prior art is determined. That is, when the condition of $(L1-L2)^3 + L2^3 < (L0/2)^3$ is determined, this condition is satisfied if n is about 4 or less. That is, if the length of the longer transfer electrode is not more than 4 times the length of the shorter transfer electrode, the time required for transferring by the charge transfer device of the embodiment will be shorter than in the prior art.

Next is considered the case in which the length of the longer transfer electrode is 1.6 times or less of the length of the shorter transfer electrode.

It is desirable to determine the conditions in which the time required for transferring the charge from the shorter transfer electrode to the longer transfer electrode is superior to that of the prior art. That is, it is desirable to determine the conditions in which $L3^3 < (L0/2)^3$, if n is 1 or more. If the length of the longer transfer electrode is 1 times or more of the length of the shorter transfer electrode, the time required for transferring in the charge transfer device in the embodiment will be shorter than in the prior art.

Besides, for example, at L1=2L3, L2 is supposed to be variable at this time. In this case, as mentioned above, the time required for transferring from the longer transfer electrode to the shorter transfer electrode will be dominant, and it is enough when $(L1-L2)^3 + L2^3$ is smaller than $(L0/2)^3$.

Supposing here L2=mL1, it follows that $(L1-L2)^3 + L2^3 = (1-m)^3 \times L1^3 + m^3 L1^3$. Since L1+L3=L0, it is known that $L1=(2L0/3)^3$, so that $(L1-L2)^3 + L2^3 = L2^3 = [(1-m)^3 + m^3] \times (2L0/3)^3$. In summary, values which are smaller than in the prior art are determined. That is, obtaining m from $(1-3m+3m^2) \times (\frac{2}{3})^3 \times L0^3 < (L0/2)^3$, $0.26 < m < 0.74$ is obtained.

Hence, if the length of the n diffusion layer disposed beneath the longer transfer electrode is somewhere between 0.4 times and 2.8 times the length of the n$^-$ diffusion layer, the time required to transfer is shorter than in the conventional charge transfer device. The range of this value of m varies with the ratio of the length of the longer transfer electrode and the length of the shorter transfer electrode.

From the above explanations, the following fact is known.

In this embodiment, the length of the longer transfer electrodes 56, 58, 60 is set about twice the length of the shorter transfer electrodes 55, 57, 59, and the length of the n diffusion layer 53 (in the lateral direction on the sheet of paper) is formed to be about half the length of the transfer electrodes 56, 58, 60. Meanwhile, the position of the right end of the n diffusion layers 53 nearly coincides with that of the right end of the transfer electrodes 56, 58, 60 formed on the gate oxide film in the spatial position. The charge transfer device having such features has been explained above.

At this time, when the length of the longer transfer electrodes 56, 58, 60 is longer than 1.6 times the length of the shorter transfer electrode 55, 57, 59, the time required for transfer is dominated by the time required for transferring the charges from the longer transfer electrodes to the shorter transfer electrodes.

Supposing the longer transfer electrode to be n times longer than the shorter transfer electrodes, in the buried channel charge transfer device, n is required to be set at 4 or less because the intensity of the fringe electric field determines the time required for transfer.

Besides, as for the transfer time of the longer transfer electrodes 56, 58, 60, if the length of the longer transfer electrodes 56, 58, 60 is shorter than 1.6 times the length of the shorter transfer electrodes 55, 57, 59, the time required for transferring the charges from the shorter transfer electrodes to the longer transfer electrodes will be dominant. At this time, the value of n must be greater than 1.

The individual transfer electrodes 55 to 60 are protected by insulation film 61 made of $SiO_2$. The transfer electrodes 55 to 60 are connected to the driving voltage application terminals 62, 63, 64, 65. Four specified voltages are applied to the individual terminals 62 to 65. In the charge transfer device as shown, four transfer electrodes of a certain transfer electrode 56, its adjacent transfer electrode 57, the next adjacent transfer electrode 58 and its adjacent transfer electrode 59 are grouped together as one unit, and the individual transfer electrodes 56 to 59 are connected to the terminals 62 to 65. Likewise, the units individually composed of four transfer electrodes are formed continuously in adjacent units.

Here, the voltages applied to the terminals 62, 63, 64, 65 are φ1, φ2, φ3, φ4, respectively.

FIG. 2 shows driving waveforms when applying a specified voltage to the charge transfer device of the invention.

In the driving waveforms, the state of the voltage higher than zero volts is called H (high) state, and the state of the voltage lower than zero volts is called L (low) state.

In the diagram, T1, T2, T3, T4, T5, T6 denote the holding time (time axis) indicated by the both ends of the arrow, and t1, t2, t3, t4, t5 indicate the central value of the time axes of T1, T2, T3, T4, T5.

The operation of one unit of the transfer electrodes 56, 57, 58, 59 is explained below.

In the initial state, φ1 is H, φ2 is L, φ3 is H and φ4 is H. In this state, channels are formed on the surface of the semiconductor substrate 51 just beneath the transfer electrodes 56, 58, 59. In these portions, potential wells are formed, and charges can be stored. The voltage of transfer electrode 57 enclosed by the transfer electrodes 56, 58, 59 is L, and a channel is not formed. Thus, in the initial state, the charges are ready to be stored in the channels just below the transfer electrodes 56, 58, 59.

FIG. 3 shows the potential distribution of the channel portion at time t1 to t5 shown in FIG. 2. On the axis of ordinates, the downward direction is the positive direction. Numerals 16, 17 are charges. Regions A2 to I2 correspond to regions A2 to I2 of the transfer electrodes and diffusion layers shown in FIG. 1.

In the initial state, φ1 is H, φ2 is L, φ3 is H and φ4 is H, and channels are formed on the surface of the semiconductor substrate 51 just beneath the transfer electrodes 56, 58, 59. In this state, in FIG. 3, φ4 is H in region A2, and a channel is formed just beneath the transfer electrode 59. Since φ1 of the transfer electrode 56 is H, channels are also formed in region B2 and region C2. The potential well is deeper in region C2 than in region B2, which is because n diffusion layer 53 is formed in region C2. Therefore the region C2 has a higher potential than the region B2. Furthermore, in the initial state, as indicated by the dotted line in the diagram, channels are formed in regions E2, F2 of the transfer electrode 58, region G2 of the transfer electrode 59, and regions H2, I2 of the transfer electrode 60. In these areas, the charges are stored.

When the voltage of φ3 is changed from H to L, the charges 16, 17 stored in the regions E2, F2 of the channel just beneath the transfer electrode 58 are all moved to the regions G2, H2, I2 in the adjacent channel portion. This state indicates the state of t=t1. That is, a voltage of H is applied to the transfer electrodes 56, 59, and a voltage L is applied to the transfer electrodes 57, 58.

When the voltage of φ2 is changed from L to H, a channel is formed in region D2 just beneath the transfer electrode 57. At this time, a part of the charges 16, 17 stored in the regions A2, B2, C2 of the channels just beneath the transfer electrodes 55, 56 is also moved to the region D2. In this state, t=t2. In other words, a voltage of H is applied to the transfer electrodes 56, 57, 59, and a voltage L is applied to the transfer electrode 58.

When the voltage of φ4 is changed from H to L, the charges 16, 17 stored in the regions A2, G2 in the channels just beneath the transfer electrodes 55, 59 are all moved to the regions B2, C2, D2, and the regions H2, I2, respectively in the adjacent channel. In this state, t=t3. That is, a voltage of H is applied to the transfer electrodes 56, 57, and a voltage L to the electrodes 58, 59.

By this operation, the charges 16, 17 are moved by the distance of one transfer electrode. The same operation is repeated thereafter to transfer the charges sequentially.

That is, when the voltage of φ3 changes from L to H, channels are formed in the regions E2, F2 just beneath the transfer electrode 58. At this time, a part of the charges 16, 17 stored in the regions B2, C2, D2 of the channels beneath the transfer electrodes 56, 57 also moves to the regions E2, F2. In this state, t=t4. That is, a voltage of H is applied to the transfer electrodes 56, 57, 58, and a voltage L to the transfer electrode 59.

When the voltage of φ1 is changed from H to L, the charges 16, 17 stored in the regions B2, C2, I2 in the channels just beneath the transfer electrodes 56, 60 are all moved to the regions D2, E2, F2 respectively in the adjacent channel. In this state, t=t5. That is, a voltage of H is applied to the transfer electrodes 57, 58, and a voltage L is applied to the transfer electrodes 55, 56, 59, 60.

Thus, the charges 16, 17 are sequentially moved in the channels just beneath the transfer electrodes.

Figure 4:
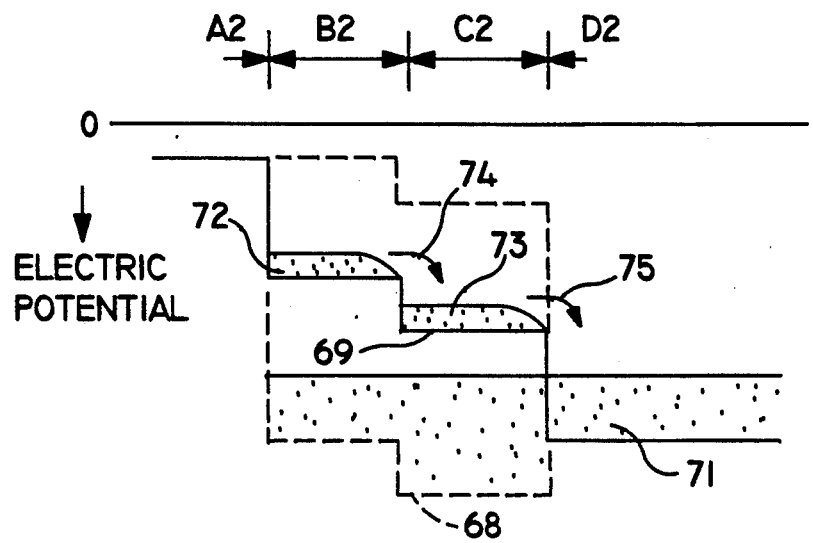
FIG. 4 is a diagram showing the detailed mode of signal charge of a charge transfer device in the first embodiment of the invention.

FIG. 4 shows a transient state of the potential distribution from t=t4 to t=t5 in FIG. 3.

The regions A2, B2, C2, D2 correspond to those in FIG. 1, respectively. That is, the region A2 corresponds o the n− diffusion layer 52 under the transfer electrode 55, region B2 to the n− diffusion layer 52 under the transfer electrode 56, region C2 to the n diffusion layer 53 under the transfer electrode 56, and region D2 to the n− diffusion layer 52 under the transfer electrode 57.

A dotted line 68 denotes a potential distribution at t=t4. A region 71 shows the charges stored in the regions B2, C2, D2 at t=t4.

A solid line 69 represents a transient potential distribution. Regions 72, 73 show the mode of charges on the transient from t=t4 to t=t5.

A dotted line 70 shows a potential distribution at t=t5. Arrows 74, 75 express the move of charges. An arrow 74 shows the move from region B2 to region C2, and arrow 75 shows the move from region C2 to region D2.

The transfer electrode 56 shown in FIG. 1 changes from H to L by φ1. At this time, in the regions B2, C2 of the transfer electrode 56, the formed channel is changed from broken line 68 to broken line 70. The charges 71 stored in the region C2 when φ1 is H are moved to the channel of the region D2 under the adjacent transfer electrode 57 when φ1 becomes L. At this time, the majority of the charges are moved by the coulombic force. Accordingly, the charges 72, 73 are left over slightly in the regions B2, C2. These charges 72, 73 are transferred toward the adjacent potential well independently by the diffusion and fringe electric field. Substantially, it may be regarded that the gate length of the channel has come to be about ½ times of the length of the electrode 56.

For example, as mentioned above, since the lengths of the regions B2, C2 are formed nearly equal in this case, as compared with the conventional structure in which the impurity concentration of the substrate beneath one transfer electrode is uniform, the electrode arrangement of this embodiment is equivalent to a series arrangement of two transfer electrodes of which the gate length is ½ times. Therefore, as compared with the conventional structure, the number of transfer stages is one more. However, the greater effect of shortening the gate length is realized in this embodiment.

Generally, in a charge transfer device of the buried channel type, the transfer by fringe electric field is more dominant than that by diffusion, and the transfer time required for transfer is nearly proportional to the third power of the gate length. The maximum point of the potential in the transfer channel from the transfer electrode, or the distance to the position for transferring a small charge is greater as compared with the charge transfer device of a surface channel type. Accordingly, it is more likely to have effects from the adjacent transfer electrode.

As compared with the prior art, in the charge transfer device of the embodiment, the effective gate length is about ⅔ times, so that the transfer time may be shortened significantly.

However, taking note of the longer transfer electrodes 56, 58, 60, it is required to transfer the distance of two gates at once, and the transfer time is shortened to about 60% of the prior art. More specifically, the gate length is ⅔ times of the prior art, and the transfer time is proportional to the third power of the gate length to transfer two stages at once, so that the transfer time is $(⅔)^3 33\ 2=0.59$ times of the prior art.

The transfer time required to transfer the charges in the channel beneath the longer transfer electrodes to beneath the shorter transfer electrodes in this way is about 2 times longer than the transfer time required to transfer from the channel beneath the shorter transfer electrodes to beneath the longer transfer electrodes.

Therefore, as shown in FIG. 2, after the voltage of the longer transfer electrodes 56, 58, 60 is changed from H to L, it is driven so as to hold the state of L about 2 times longer than the other state. By maintaining this relation, meanwhile, if the transfer efficiency is the same, the transfer speed is increased about 1.7 times as compared with the prior art.

Owing to such reason, the holding times T1 and T5 shown in FIG. 2 are set longer than the holding times T2, T3, T4 and T6 of the other state. Thus, it is possible to provide a certain allowance for the time required to transfer the charges beneath the longer transfer electrodes to beneath the adjacent shorter transfer electrodes, and the charges are not left over during such transfer processes, so that the charge transfer is performed effectively.

A second embodiment relating to the charge transfer device of the invention is described below while referring to FIGS. 5 and 6.

Figure 5:
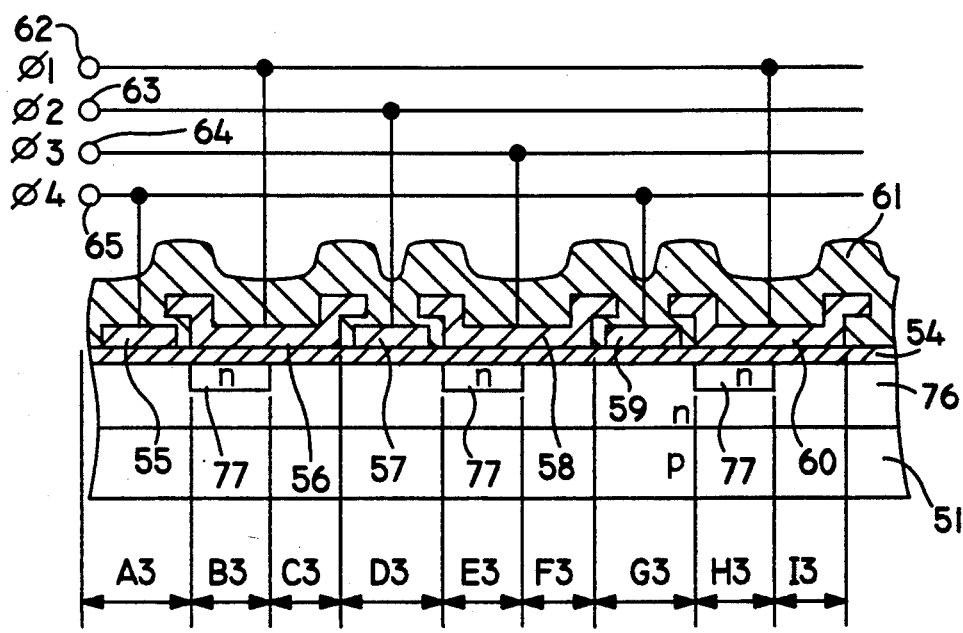
FIG. 5 is a sectional view of a charge transfer device in a second embodiment of the invention.

The structure of the charge transfer device of the invention is shown in FIG. 5.

In the diagram, the regions A3, B3, C3, D3, E3, F3, G3, H3, I3 denote the regions corresponding to the transfer electrodes and diffusion layers respectively.

An n diffusion layer 76 of about 0.5 μm in thickness is formed on a semiconductor substrate 51 which is a p-type silicon wafer. The impurity concentration of the n diffusion layer 76 is about $7 \times 10^{16}/cm^3$. The depth of the n-diffusion layer 76 is set to such an extent so that the charges of the charge amount that can be handled with the voltage applied to the transfer electrode may not be influenced by the interface level of silicon and $SiO_2$.

In the surface region of the n diffusion layer 76, a plurality of n⁻ diffusion layers 77 are formed at equal intervals. The interval of the adjacent n⁻ diffusion layers 77 is about 5 to 10 μm. The depth of the n⁻ diffusion layer 77 is about 0.5 μm. The impurity concentration of the n⁻ diffusion layer 77 is about $6 \times 10^{16}/cm^3$.

The depth of the n⁻ diffusion layer 77 is set to such an extent that the charges of the charge amount that can be handled with the voltage applied to the transfer electrode may not be influenced by the interface level of silicon and $SiO_2$. The impurity concentration of the n⁻ diffusion layer 77 is set so that the channel potential may be higher by about half of the driving pulse voltage at the n diffusion layer 76 as compared with the n⁻ diffusion layer 77, when a positive voltage is applied to the n⁻ diffusion layer 77 and n diffusion layer 76 to completely deplete the diffusion layer. The n⁻ diffusion layer 77 or the n diffusion layer 76 is a so-called buried channel region.

On the n diffusion layer 76, an insulation film 54 made of $SiO_2$ or SiN or their laminate structure is formed. The insulation film 54 is formed beneath the transfer electrodes 55, 56, 57, 58, 59, 60 explained later, and the insulation film 54 functions as a gate insulation film for the transfer electrodes 55 to 60.

On the insulation film 54, transfer electrodes having two different shapes are formed. The transfer electrodes of two types are arranged alternately. In the diagram, from left to right, the transfer electrode 55, the transfer electrode 56 adjacent thereto, the transfer electrode 57 adjacent thereto, the transfer electrode 58 adjacent thereto, and similarly the transfer electrodes 59, 60 are formed as shown in FIG. 5.

These transfer electrodes 55 to 60 largely differ in length (lateral direction on the sheet of paper). The length of the longer transfer electrodes 56, 58, 60 is formed about twice the length of the shorter transfer electrodes 55, 57, 59. The position of the left end of the n⁻ diffusion layer 77 coincides nearly with that of the left end of the transfer electrodes 56, 58, 60 formed on the gate oxide film in spatial position. The length of the n⁻ diffusion layer 77 (lateral direction on the sheet of paper) is formed at about half the length of the transfer electrodes 56, 58, 60. When a voltage is applied to the charge transfer device in such a structure, a channel is formed (not shown) on the surface of the semiconductor substrate 51 located just beneath the transfer electrodes 55 to 60. In this example, the channel is formed continuously on the surface of the semiconductor substrate 51. That is, the channels are formed in three regions, i.e. the n diffusion layer 76 on the semiconductor substrate 51 just beneath the shorter electrodes 55, 57, 59, the n diffusion layers 76 on the semiconductor substrate 51 just beneath the longer transfer electrodes 56, 58, 60, and the n⁻ diffusion layers 77 formed just beneath the transfer electrodes 55, 58, 60. The length of each channel (the length in the lateral direction on the sheet of paper) is nearly equal.

The impurity concentration of the n⁻ diffusion layers 77 is lower than the impurity concentration of the n diffusion layer 76.

In this embodiment, the ratio of the impurity concentration of n⁻ diffusion layer 77 to n diffusion layer 76 is set to be about 1.3 times. This value of the ratio influences the driving voltage and driving frequency of the transfer electrodes in order to transfer the charges completely. Accordingly, it is so set that the potential difference caused in the channel may be about ½ times of the driving pulse voltage.

Thus, as explained in the first embodiment, when the n diffusion layer 76 and the n⁻ diffusion layers used as the buried channel region 77 formed in the semiconductor substrate 51 are set in a depletion state, the channel potential formed in the n⁻ diffusion layer 76 and n diffusion layers 77 is higher in the n diffusion layer 76 than in the n⁻ diffusion layers 77.

To quicken the transfer speed of the charge transfer device, the charges in the potential well beneath a certain transfer electrode should be transferred to the potential well in the adjacent transfer electrode at a faster speed. If, however, an attempt is made to raise this transfer speed, this transfer speed is limited by the diffusion and the intensity of the fringe electric field.

Generally, when transferring all charges by diffusion only, the transfer time is proportional to the square of the gate length of the transfer electrode. Similarly, when transferring all charge by the fringe electric field alone, the transfer time is proportional to the third power of the gate length. Therefore, to shorten the time required for transfer, the gate length should be shortened. In this embodiment, by determining the spatial position so that the position of the left end of the n⁻ diffusion layer 77 may coincide with that of the left end of the longer transfer electrode 55, the gate length may be substantially shortened to about ⅔ times of the prior art.

When the gate length becomes ⅔ times of the prior art in this way, the transfer speed is quickened by about 1.7 times.

In this embodiment, the length of the longer transfer electrodes 56, 58, 60 is formed about twice the length of the shorter transfer electrodes 55, 57, 59, and the length of the n⁻ diffusion layers 77 (lateral direction on the sheet of paper) is formed about half the length of the transfer electrodes 56, 58, 60. The position of the left end of the n⁻ diffusion layers 77 nearly coincides with that of the left end of the transfer electrodes 56, 58, 60 formed on the gate oxide film in spatial position. The charge transfer device having such features has been described above.

At this time, when the length of the longer transfer electrodes 56, 58, 60 is set longer than 1.6 times the length of the shorter transfer electrodes 55, 57, 59, or when the length of the n⁻ diffusion layers 77 is set longer than half the length of the transfer electrodes 56, 58, 60, or if shorter, the formula shown in the first embodiment may be applied directly.

Meanwhile, the position of the left end of the n⁻ diffusion layers 77 and the left end of the transfer electrodes 56, 58, 60 formed on the gate oxide film are nearly coinciding in the spatial position, but when the position of the left end of the n⁻ diffusion layers 77 is located at the left side from that of the left end of the transfer electrodes 56, 58, 60, reaching beneath the transfer electrodes 55, 57, 59, charges are left over during the charge transfer process. Such leftover charges do not matter if deviated to the position nearly coinciding with the right end of the transfer electrodes 55, 57, 59.

Furthermore, the position of the left end of the n⁻ diffusion layers 77 is nearly coinciding with that of the left end of the transfer electrodes 56, 58, 60 formed on the gate oxide film in spatial position, but when the position of the left end of the n⁻ diffusion layers 77 is located at the right side from that of the left end of the transfer electrodes 56, 58, 60, charge leftovers may be caused during the charge transfer process. To eliminate charge leftovers, it is sufficient to adjust the position of the left end of the transfer electrodes 56, 58, 60.

The individual transfer electrodes 55 to 60 are protected with insulation film 61 made of $SiO_2$. The transfer electrodes 55 to 60 are connected to driving voltage application terminals 62, 63, 64, 65. The specified four voltages are applied to the individual terminals 62 to 65. In the shown charge transfer device, four transfer electrodes consisting of a certain transfer electrode 56, its adjacent transfer electrode 57, another adjacent transfer electrode 58 and its adjacent transfer electrode 59 are grouped together as one unit, and the transfer electrodes 56 to 59 are connected to the terminals 62 to 65. Likewise, the units consisting of four transfer electrodes are continuously formed as adjacent units.

In this embodiment, the voltages applied to the terminals 62, 63, 64, 65 are desirably $\phi 1$, $\phi 2$, $\phi 3$, $\phi 4$, respectively.

What is different from the first embodiment is that the n⁻ diffusion layers 77 are provided instead of the n diffusion layers 53. The impurity concentration of the n⁻ diffusion layers 77 is set lower than the impurity concentration of the n diffusion layer 76. As a result, when the n⁻ diffusion layers 77 and n diffusion layer 76 used as the buried channel type charge transfer device are set in a depletion state, the channel potential is lower in the n⁻ diffusion layers 77 than in the n diffusion layer 76.

Figure 6:
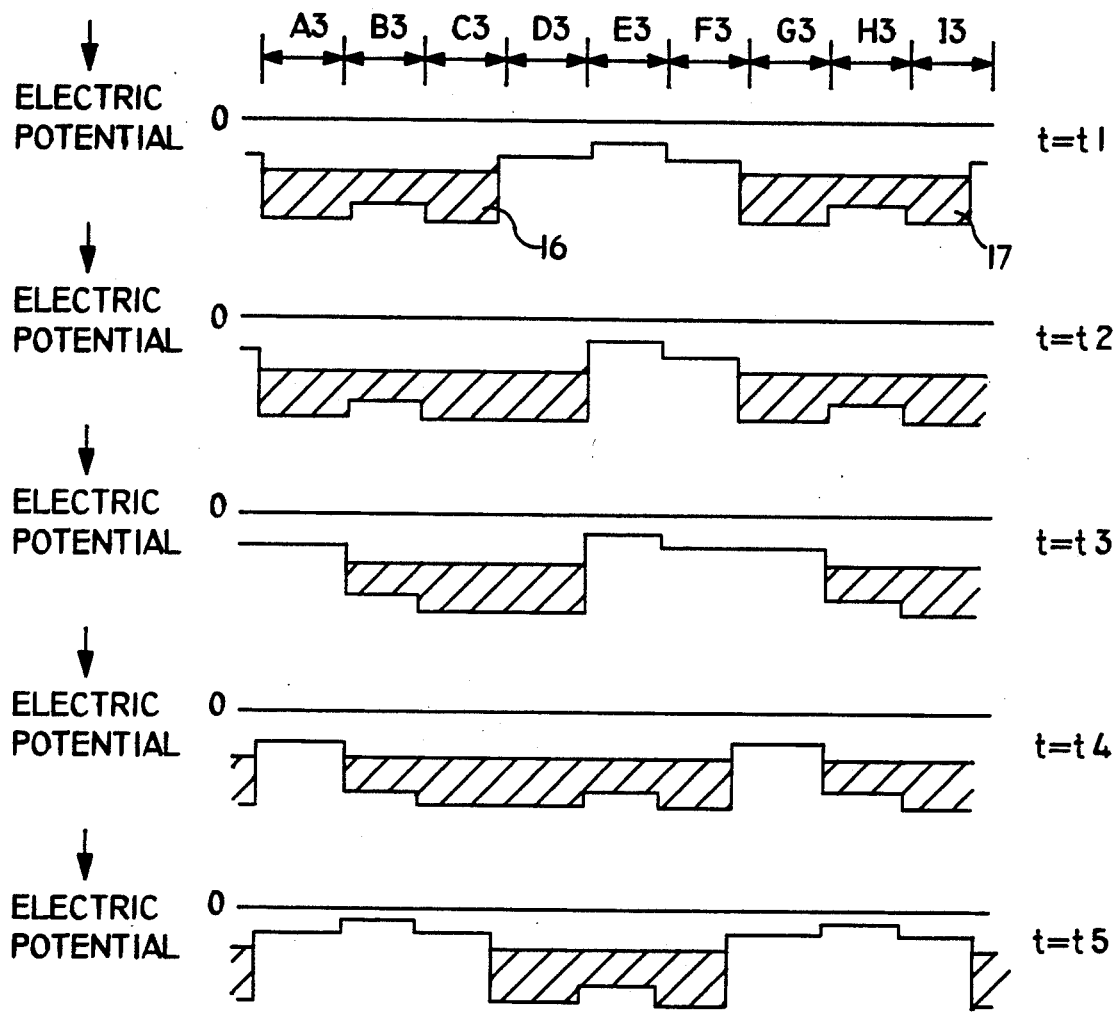
FIG. 6 is a diagram showing the model of signal charge of a charge transfer device in the second embodiment of the invention.

FIG. 6 shows the potential distribution of the channel when applying a specified voltage explained in FIG. 2 to the charge transfer device of the invention. Numerals 66, 67 are charges. Regions A3 to I3 correspond to the regions A3 to I 3 shown in FIG. 5.

In the state of t=t1, a voltage of H is applied to the transfer electrodes 56, 59, and a voltage of L to the transfer electrodes 57, 58. When the voltage of the transfer electrode 58 changes from H to L, the charges 16, 17 stored in the channel regions E3, F3 just beneath the transfer electrode 58 are moved entirely to the regions G3, H3, I3 in the adjacent channel.

In the state of t=t2, a voltage of H is applied to the transfer electrodes 56, 57, 59, and L to the transfer electrode 58. When the voltage of the transfer electrode 57 changes from L to H, a channel is formed in the region D3 just beneath the transfer electrode 57. At this time, a part of the charges 16, 17 stored in the regions A3, B3, C3 just beneath the transfer electrodes 55, 56 are also moved to the region D3.

In the state of t=t3, a voltage of H is applied to the transfer electrodes 56, 57, and a voltage L to the transfer electrodes 58, 59. When the transfer electrodes 55, 59 change from H to L, the charges 16, 17 stored in the regions A3, G3 in the channels just beneath the transfer electrodes 55, 59 are entirely moved to the regions B3, C3, D3 in the adjacent channel portion, and to the regions H3, I3. By this operation, the charges 16, 17 are moved to the next transfer electrode. By repeating the same operation thereafter, the charges are sequentially transferred.

That is, in the state of t=t4, a voltage of H is applied to the transfer electrodes 56, 57, 58, and a voltage L to the transfer electrode 59. When the transfer electrode 58 changes from L to H, channels are formed in regions E3, F3 just beneath the transfer electrode 58. At this time, a part of the charges 16, 17 stored in the regions B3, C3, D3 in the channels just beneath the transfer electrodes 56, 57 is also moved to the regions E3, F3.

In the state of t=t5, a voltage of H is applied to the transfer electrodes 57, 58, and L to the transfer electrodes 55, 56, 59, 60. When the transfer electrodes 56, 60 change from H to L, the charges 16, 17 stored in the regions B3, C3, I3 just beneath the transfer electrodes 56, 60 are all moved to the regions D3, E3, F3 of the adjacent channel portion.

In this way, the charges 16, 17 are sequentially moved in the channels just beneath the transfer electrodes.

Generally in a buried channel type charge transfer device, transfer is dominated by the intensity of the fringe electric field rather than by diffusion, and the transfer time required for transfer is nearly proportional to the third power of the gate length. As compared with the prior art, in the charge transfer device of this embodiment, the effective gate length is about $\frac{2}{3}$ times, so that the transfer time is notably shortened.

However, taking note of the longer transfer electrodes 56, 58, 60, it is required to transfer the distance of two gates at once, and the transfer time is shortened to about 60% of the prior art. The transfer time required for transferring the charges in the channel beneath the longer transfer electrode to beneath the shorter transfer electrode in this way is about twice longer than the transfer time required for transferring from the channel beneath the shorter transfer electrode to beneath the longer transfer electrode.

Therefore, as shown in FIG. 2, after the voltage of the longer transfer electrodes 56, 58, 60 is changed from H to L, it may be driven to hold the state of L longer by about twice the other state. When this relation is maintained, if the transfer efficiency is equal, the transfer speed is increased about 1.7 times of the prior art.

Owing to this reason, the holding times T1 and T5 shown in FIG. 2 are set longer than the holding times T2, T3, T4 and T6 in the other state. Thus, there is a certain allowance for the time required for transferring the charges beneath the longer transfer electrode to the adjacent shorter transfer electrode, and the charges may be transferred completely and securely without leftovers.

As a third embodiment of the invention, the charge transfer device of the so-called two-phase drive type is explained below while referring to FIG. 7.

Figure 7:
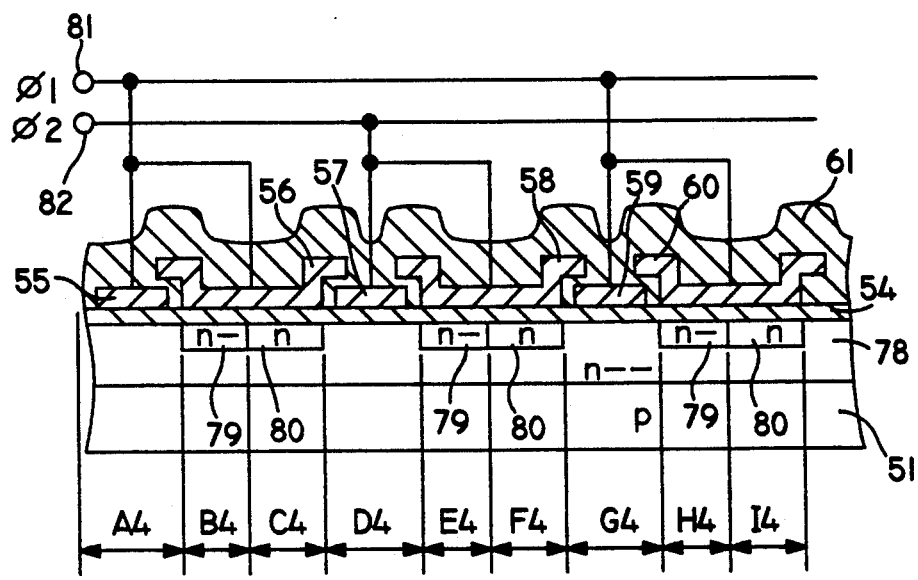
FIG. 7 is a sectional view of a charge transfer device in a third embodiment of the invention.

The structure of the charge transfer device of the invention is shown in FIG. 7.

In the diagram, regions A4, B4, C4, D4, E4, F4, G4, H4, I4 denote the regions corresponding to the transfer electrodes and diffusion layers.

An $n^{--}$ diffusion layer 78 of about 0.5 μm in thickness is formed on a semiconductor substrate 51 which is a p-type silicon wafer. The impurity concentration of the $n^{--}$ diffusion layer 78 is about $5 \times 10^{16}/cm^3$. This value of the impurity concentration is determined by the relation with the maximum charge that can be handled and the voltage applied to the transfer electrode. The depth of the $n^{--}$ diffusion layer 78, the $n^{-}$ diffusion layer 79, and the n diffusion layer 80 is set to such an extent as to be free from the affects of the interface level existing between the silicon and SiO₂ in any diffusion layers when reaching the maximum charge that can be handled.

In the surface region of the $n^{--}$ diffusion layer 78, a plurality of $n^{-}$ diffusion layers 79 are formed at equal intervals. The interval of the adjacent $n^{-}$ diffusion layers 79 is about 5 to 10 μm. The depth of the $n^{-}$ diffusion layers 79 is about 0.5 μm. The impurity concentration of the $n^{-}$ diffusion layers 79 is about $6 \times 10^{16}/cm^3$. The impurity concentration of the $n^{-}$ diffusion layers 79 is set so that the potential difference applied to the channel to the $n^{--}$ diffusion layer 78 may be about $\frac{1}{3}$ times of the driving pulse voltage when the $n^{-}$ diffusion layers are depleted. The $n^{-}$ diffusion layer 79 is a so-called buried channel region.

Furthermore, adjacent to the $n^{--}$ diffusion layers 79, the n diffusion layers 80 in a depth of about 0.5 μm are formed. The sum of the length of the $n^{-}$ diffusion layer 79 and the length of the n diffusion layer 80 is equal nearly to the length of each transfer electrode 57, 58 or 60.

On the surface of the $n^{--}$ diffusion layer 78, a plurality of n diffusion layers 80 are formed at equal intervals. The interval of the adjacent n diffusion layers 80 is about 5 to 10 μm. The depth of the n diffusion layers 80 is about 0.5 μm. The impurity concentration of the n diffusion layers 80 is about $7 \times 10^{16}/cm^3$. The impurity concentration of the n diffusion layers 80 is set so that the potential difference of the channel from the $n^{--}$ diffusion layer 78 may be about $\frac{2}{3}$ times of the driving pulse voltage when the n diffusion layers 80 are depleted. Meanwhile, the n diffusion layer 80 will be a so-called buried channel region.

The depth of the n diffusion layers 80 is nearly equal to the depth of the $n^{-}$ diffusion layers 79. According to this construction, the channel depths at the time of transferring may be nearly aligned.

The ratio of impurity concentration of the n diffusion layer 80 and the $n^{-}$ diffusion layer 79 is about 1.3 times. By defining so, when depleted, the potential difference of the channel from the $n^{--}$ diffusion layer 78 will be about $\frac{1}{3}$ times of the driving pulse voltage.

On the $n^{--}$ diffusion layer 78, an insulation film 54 made of SiO₂ or SiN or their laminate structure is formed. The insulation film is formed beneath the transfer electrodes 55, 56, 57, 58, 59, 60 as mentioned below, and the insulation film 54 functions as a gate insulation film for the transfer electrodes 55 to 60.

On the insulation film 54, transfer electrodes having two different shapes are formed. These transfer electrodes of two types are arranged alternately. That is, in the diagram, from left to right, the transfer electrode 55, the transfer electrode 56 at its side, the transfer electrode 57 at its side, the transfer electrode 58 at its side, and similarly the transfer electrodes 59, 60 are formed as shown in FIG. 7.

These transfer electrodes 55 to 60 are largely different in their length (lateral direction on the sheet of paper). The length of the longer transfer electrodes 56, 58, 60 is formed at about 1.6 times the length of the shorter transfer electrodes 55, 57, 59.

The position of the left end of the $n^{-}$ diffusion layers 79 nearly coincides with that of the left end of the transfer electrodes 56, 58, 60 formed on the gate oxide film in spatial position. Furthermore, the position of the right end of the n diffusion layers 80 and that of the right end of the transfer electrodes 56, 58, 60 formed on the gate oxide film nearly coincide with each other in the spatial position. The length (lateral direction on the sheet of paper) of the $n^{-}$ diffusion layer 79 or the length of the $n^{-}$ diffusion layer 80 is formed at about half the length of the transfer electrodes 56, 58, 60. When a voltage is applied to the charge transfer device in such a structure, channels are formed (not shown) on the surface of the semiconductor substrate 51 just beneath the transfer electrodes 55 to 60.

In this embodiment, the channels, are formed continuously on the surface of the semiconductor substrate 51. That is, channels are formed in three regions, i.e. the $n^{--}$ diffusion layer 78 on the semiconductor substrate 51 just beneath the shorter transfer electrodes 55, 57, 59, the n⁻ diffusion layers 79 just beneath the longer transfer electrodes 56, 58, 60, and the n diffusion layers 80 formed just beneath the transfer electrodes 56, 58, 60. The length of the channels (in the lateral direction on the sheet of paper) is nearly equal each other.

The impurity concentration of the n diffusion layers 80 is higher than the impurity concentration of the n⁻ diffusion layers 79.

In this embodiment, the ratio of the impurity concentration of the n diffusion layers 80 and the n-diffusion layers 79 is set to be about 1.4 times. This value of the ratio means the potential difference of the channel to the n⁻⁻ diffusion layer 78 is about ⅔ of the driving pulse voltage when depleted.

By thus defining, as in the first embodiment, when the n⁻ diffusion layer 79 and n diffusion layers 80 used as the buried channel regions, and the n⁻⁻ diffusion layer 78 formed on the semiconductor substrate 51 are depleted, the potential of the channels formed in the n⁻ diffusion layers 79, n diffusion layers 80 and n⁻⁻ diffusion layer 78 becomes higher in the n⁻ diffusion layers 79 than in the n⁻⁻ diffusion layer 78, and higher in the n diffusion layers 80 than in the n⁻⁻ diffusion layer 78. Besides, the potential of the channels formed in the n diffusion layers 80 and n⁻ diffusion layers 79 is higher in the n diffusion layers 80 than in the n⁻ diffusion layers 79.

To quicken the transfer speed of the charge transfer device, the speed of transferring the charges at the potential well just beneath a certain transfer electrode to the potential well beneath the adjacent transfer electrode should be increased. However, attempts to quicken this transfer speed are limited by the diffusion and the intensity of the fringe electric field.

Generally, when transferring all charges by diffusion alone, the charge transfer time is proportional to the square of the gate length of the transfer electrode. Similarly, when transferring all signal charges by the fringe electric field, the charge's transfer time is proportional to the third power of the gate length. Therefore, to shorten the time required for transfer, the gate length is desirably shortened. In this embodiment, by determining the spatial position so that the position of the right end of the n diffusion layers 80 may coincide with that of the right end of the longer transfer electrodes 56, 58, 60, and that the left end of the n⁻ diffusion layers 79 may coincide with the left end of the longer transfer electrodes 56, 58, 60, the gate length may be substantially shortened to about ⅔ times of the prior art.

Thus, as compared with the prior art, when the gate length is ⅔ times of the prior art, the transfer speed is quickened by a factor of about two.

In this embodiment, the length of the longer transfer electrodes 56, 58, 60 is formed about twice the length of the shorter transfer electrodes 55, 57, 59, and the length of the diffusion layers 80 (in the lateral direction on the sheet of paper) is set about half the length of the longer transfer electrodes 56, 58, 60. The position of the right end of the n diffusion layers 80 nearly coincides with that of the right end of the transfer electrodes 56, 58, 60 formed on the gate oxide film in spatial position. The length of the n⁻ diffusion layers 79 (in the lateral direction on the sheet of paper) is formed in about half the length of the longer transfer electrodes 56, 58, 60. The position of the left end of the n⁻ diffusion layers 79 nearly coincides with that of the left end of the transfer electrodes 56, 58, 60 formed on the gate oxide film in spatial position. The charge transfer device having such features has been described hereinabove.

At this time, the length of the n⁻ diffusion layers 79 formed just beneath the transfer electrodes 56, 58, 60 is desirably L1, the length of the adjacent n diffusion layers 80 is desirably L2, and the length of the n⁻⁻ diffusion layer 78 adjacent to the other end of the n diffusion layers 80 is desirably L3. Suppose L1+L2+L3=L0.

The charge transfer time T is expressed as T=K×(L1³+L2³+L3³), where K is a constant.

In the two-phase drive charge transfer device of the prior art, since L2=0, L1=L3=L0/2, the charge transfer time T0 is expressed as T0=L0³×K/4.

First, it is assumed that the length of the transfer electrode is fixed.

Furthermore, L1+L2=2L3=2L0/3, L1=nL0. Hence,: L2=[(⅔−n)]×L0, L3=L0/3. At this time, the charge transfer time T1 is as follows:

$$T1 = \left(2n^2 - \frac{4n}{3} + \frac{1}{3}\right) \times L0^3 \times K$$

In order that T1 be shorter than T0, the n to satisfy the inequality T1<T0 is determined.

The value of n is in a range of 0.07≦n≦0.6.

Hence, 0.1≦[L1/(L1+L2)]≦0.9.

When the length of the longer transfer electrodes 56, 58, 60 is twice the length of the shorter transfer electrodes 55, 57, 59, if the length of the n⁻ diffusion layer 79 is in a range of 10% to 90% of the length of the longer transfer electrodes 56, 58, 60, the charge transfer time may be shorter than the conventional structure.

Next it is assumed that the length of the transfer electrode is variable.

Furthermore, L1=L2=mL0, L3=(1−2m) L0, 0<m<0.5 and the charge transfer time T2 is T2=(−6m³+12m²−6m+1) L0³×K.

In order that T2 be shorter than T0 of the prior art, the value of m satisfying the inequality T2<T0 is determined.

The value of m is in the range 0.19<m<0.5.

Furthermore, 0.61<(L1+L2)/L3.

Hence, as far as the length of the n⁻ diffusion layers 79 just beneath the longer transfer electrodes 56, 58, 60 is equal to that of the n diffusion layers 80, if the length of the longer transfer electrodes 56, 58, 60 is 0.61 times or more of the length of the shorter transfer electrodes 55, 57, 59, the transfer time may be shorter than the time required in the charge transfer device of the conventional structure.

In addition, although the position of the left end of the n⁻ diffusion layers 79 nearly coincides with that of the left end of the transfer electrodes 56, 58, formed on the gate oxide film in the spatial position, if the position of the left end of the n⁻ diffusion layers 79 is located at the left side of that of the left end of the transfer electrodes 56, 58, 60, as in the first embodiment, it does not matter if the n⁻ diffusion layers 79 are deviated to the position of the right end of the adjacent transfer electrodes 55, 57, 59. Furthermore, when deviated to the left, the charges are left over when transferring the charges.

Likewise, although the position of the right end of the n diffusion layers 80 nearly coincides with that of the right end of the transfer electrodes 56, 58, 60 formed on the gate oxide film in spatial position, if the position of the right end of the n diffusion layers 80 is deviated to the right side of that of the right end of the transfer electrodes 56, 58, 60, it does not matter if the n diffusion layers 80 are deviated to the position of the left end of the adjacent transfer electrodes 57, 59. If, however, further deviation to the right side occurs, charges may be left over during the transferring process.

The individual transfer electrodes 55 to 60 are protected with an insulation film 61 made of $SiO_2$. The transfer electrodes 55 to 60 are further connected to driving voltage application terminals 81, 82. A specified two voltages are applied to the individual terminals 81, 82.

The voltages applied to the terminals 81, 82 are respectively called $\phi 1$, $\phi 2$.

The shorter transfer electrode 55 and the longer transfer electrode 56 are connected to the terminal 81 and applied with the voltage of $\phi 1$. The shorter transfer electrode 57 and the longer transfer electrode 58 are connected to the terminal 82 and applied with a voltage of $\phi 2$. The shorter transfer electrode 59 and the longer transfer electrode 60 are connected to the terminal 81 and applied with a voltage of $\phi 1$.

Thus, wired units of the shorter transfer electrodes 55, 57, 59, the longer transfer electrodes 56, 58, 60, and the terminals 81, 82 are connected repetitively.

In this charge transfer device, what is different from the first embodiment is that the buried channel type charge transfer device is used as the $n^{--}$ diffusion layer 78, and that $n^-$ diffusion layers 79 and n diffusion layers 80 are disposed beneath the longer transfer electrodes 56, 58, 60. The impurity concentration of the $n^-$ diffusion layers 79 is higher than the impurity concentration of the $n^{--}$ diffusion layer 78, and the impurity concentration of the n diffusion layers 80 is higher than that of the $n^-$ diffusion layers 79. By setting up in this manner, when the $n^{--}$ diffusion layer 78, the $n^-$ diffusion layers 79 and n diffusion layers 80 used as the buried channel type charge transfer device are set in a depleted state, the height of the channel potential is in the order of the n diffusion layers 80, $n^-$ diffusion layers 79, and $n^{--}$ diffusion layer 78.

Figure 8:
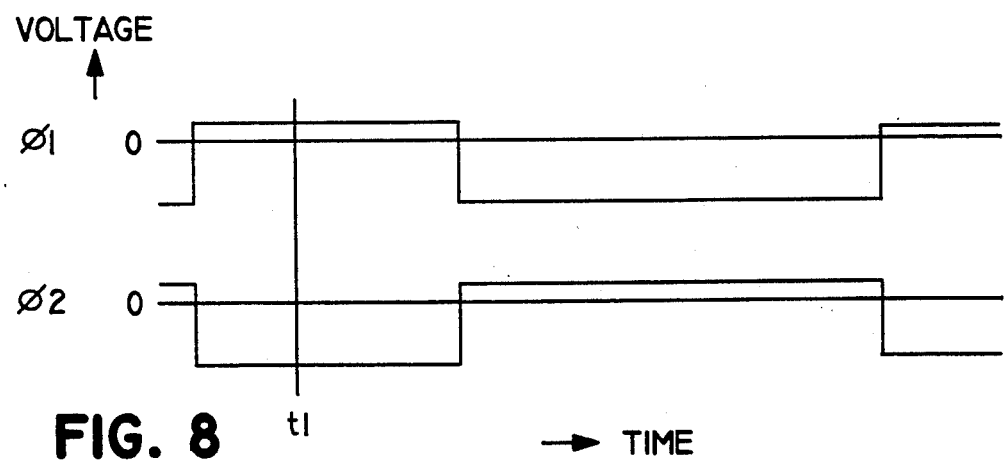
FIG. 8 is a diagram showing the state of applied voltage of a charge transfer device in the third embodiment of the invention.

FIG. 8 shows the driving waveform when applying a specific voltage to the charge transfer device.

In this driving waveform, the state of the voltage higher than zero volts is called H (high) state, and the state of the voltage lower than zero volts is called L (low) state.

In the initial state, $\phi 1$ is L, and $\phi 2$ is H. In this state, channels are formed on the surface of the semiconductor substrate 51 just beneath the transfer electrodes 57, 58. In this portion, a potential well is formed, and charges may be stored. As to the transfer electrodes 55, 56 59, 60, since the voltage is L, channels are not formed. Thus, in the initial state, the charge may be stored in the channel just beneath the transfer electrodes 57, 58.

Next, the voltages of $\phi 1$ and $\phi 2$ simultaneously become in reverse phase. That is, the voltage of $\phi 1$ changes from L to H, and the voltage of $\phi 2$ changes from H to L at the same time. By this change, channels are formed just beneath the transfer electrodes 55, 56, and the transfer electrodes 59, 60. The time of such state is indicated as $t=t1$ shown in FIG. 8.

Figure 9:
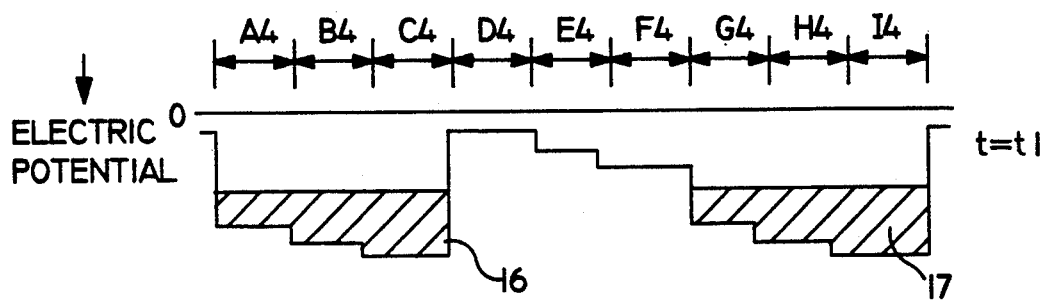
FIG. 9 is a diagram showing the mode of charges of a charge transfer device in the third embodiment of the invention.

FIG. 9 shows the potential distribution in the channel portion at time t1 shown in FIG. 8. Numerals 16 and 17 are charges. The regions A4 to I4 correspond to the regions A4 to I4 of the transfer electrodes shown in FIG. 7.

The voltage of $\phi 1$ has a reverse phase to the voltage of $\phi 2$. Accordingly, the charges stored in the regions A4, B4, C4 is lowered in the potential in the regions A4, B4, C4 when the voltages of $\phi 1$ and $\phi 2$ are in reverse phase, $\phi 1$ is L and $\phi 2$ is H, and is heightened in the potential in the adjacent regions D4, E4, F4. Accordingly, the charges 16 are moved from the regions A4, B4, C4 to the regions D4, E4, F4. At this time, the charges 17 stored in the regions G4, H4, I4 are also moved in the rightward direction in FIG. 9.

Generally, in the buried channel type charge transfer device, the transfer by fringe electric field is more dominant than that by diffusion, and the transfer time desirable in transfer is nearly proportional to the third power of the gate length. As compared with the prior art, in the charge transfer device of this embodiment, the effective gate length is about ⅔ times, and hence the transfer time is notably curtailed.

Taking note of, however, the longer transfer electrodes 56, 58, 60, it is desirable to transfer the portion of two gates at once. Accordingly, the transfer time of this embodiment is shortened to about 44% of the transfer time of the conventional charge transfer device.

Another two-phase driven charge transfer device as a fourth embodiment of the invention is described below while referring to FIG. 10.

Figure 10:
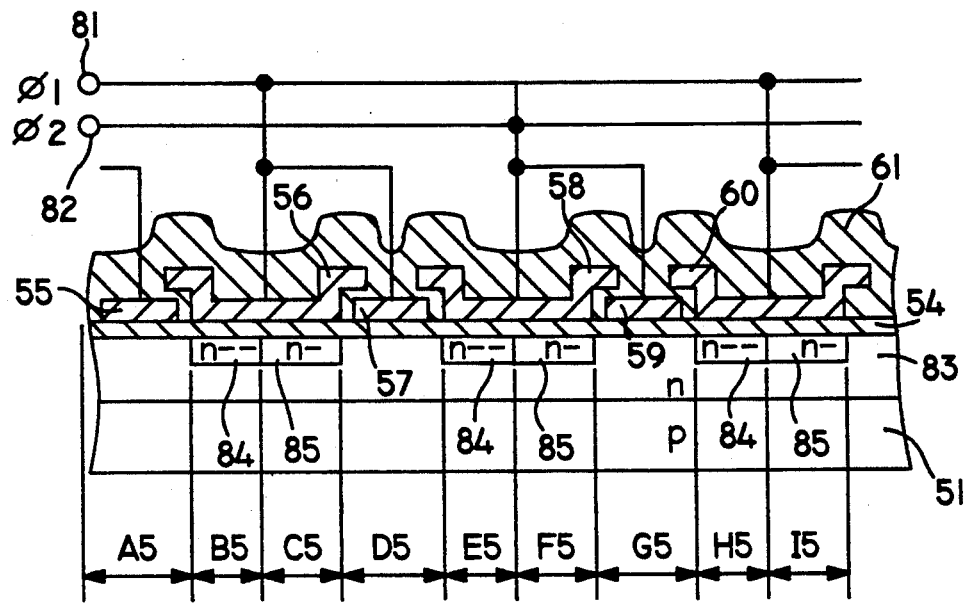
FIG. 10 is a sectional view of a charge transfer device in a fourth embodiment of the invention.

FIG. 10 shows the structure of the charge transfer device of the invention.

In the diagram, regions A5, B5, C5, D5, E5, F5, G5, H5, I5 denote the regions of the transfer electrodes.

An n diffusion layer 83 of about 0.5 μm in depth is formed on a semiconductor substrate 51 which is a p-type silicon wafer. The impurity concentration of the n diffusion layer 83 is about $5 \times 10^{16}/cm^3$. This value of impurity concentration is determined by the relation of the voltage applied to the transfer electrodes and the maximum charge amount that can be handled. The depth of the n diffusion layer 83, $n^{--}$ diffusion layers 84, and $n^-$ diffusion layers 85 is set to such extent that any diffusion layer may not be influenced by the interface level existing between the silicon and $SiO_2$ if the handled charges reach the maximum.

In the surface region of the n diffusion layer 83, a plurality of $n^{--}$ diffusion layers 84 are formed at equal intervals. The interval of the adjacent $n^{--}$ diffusion layers 84 is about 5 to 10 μm. The depth of the $n^{--}$ diffusion layers 84 is about 0.5 μm. The impurity concentration of the $n^{--}$ diffusion layers 84 is about $6 \times 10^{16}/cm^3$. The impurity concentration of the $n^{--}$ diffusion layers 84 is set so that the potential difference applied to the channel from the n diffusion layer 83 may be about ⅔ times of the driving pulse voltage when the $n^{--}$ diffusion layers 84 are depleted. The $n^{--}$ diffusion layers 84 are the so-called buried channel region.

Furthermore, adjacent to the $n^{--}$ diffusion layers 84, the $n^-$ diffusion layers 85 of about 0.5 μm in thickness is formed at equal intervals. Incidentally, the sum of the length of the $n^{--}$ diffusion layer 84 and the length of the $n^-$ diffusion layer 85 is nearly equal to the length of the transfer electrodes 56, 85, 60.

The interval for forming the $n^-$ diffusion layers 85 is about 5 to 10 μm. The depth of the $n^-$ diffusion layers 85 is about 0.5 μm. The impurity concentration of the $n^-$ diffusion layers 85 is about $7 \times 10^{16}/cm^3$. The impurity concentration of the $n^-$ diffusion layers 85 is set so that the potential difference of the channel from the n diffusion layer 83 may be about ⅔ times of the driving pulse voltage when the n⁻ diffusion layers 85 are depleted. The n⁻ diffusion layers 85 become so-called buried channel regions.

The depth of the n⁻ diffusion layers 85 is about the same as the depth of the n⁻⁻ diffusion layers 84. Thus, the depths of the channels during the charge transfer process may be nearly aligned.

The ratio of the impurity concentration of the n⁻ diffusion layers 85 and the n⁻⁻ diffusion layers 84 is about 1.3 times. By thus defining layers 84 and 85, if depleted, the potential difference of the channel from the n diffusion layer 83 may be about ⅔ times of the driving pulse voltage.

On the n diffusion layer 83, an insulation film 54 made of SiO₂ is formed. This insulation film 54 is formed beneath the transfer electrodes 55, 56, 57, 58, 59, 60 described below and functions as a gate insulation film for the transfer electrodes 55 to 60.

On the insulation film 54, transfer electrodes of two different shapes are formed. These transfer electrodes of two types are alternately arranged. That is, in this diagram, from left to right, the transfer electrode 55, the transfer electrode 56 at its side, the transfer electrode 57 at its side, the transfer electrode 58 at its side, and similarly the transfer electrodes 56, 60 are formed as shown in FIG. 10.

These transfer electrodes 55 to 60 are largely different in length (in the lateral direction on the sheet of paper). The length of the longer transfer electrodes 56, 58, 60 is formed about twice the length of the shorter transfer electrodes 55, 57, 59.

The position of the left end of the n⁻⁻ diffusion layers 84 coincides nearly with that of the left end of the transfer electrodes 56, 58, 60 formed on the gate oxide film in the spatial position. The position of the right end of the n⁻ diffusion layers 85 nearly coincides with that of the right end of the transfer electrodes 56, 58, 60 formed on the gate oxide film in the spatial position. The length of the n⁻⁻ diffusion layers 84 or the length of the n⁻ diffusion layers 85 (in the lateral direction on the sheet of paper) is formed about half the length of the transfer electrodes 56, 58, 60. When a voltage is applied to the charge transfer device in such a structure, channels are formed (not shown) on the surface of the semiconductor substrate 51 just beneath the transfer electrodes 55 to 60.

In this embodiment, the channels are continuously formed on the surface of the semiconductor substrate 51. That is, the channels are formed in three regions, i.e. the n diffusion layer 83 on the semiconductor substrate 51 just beneath the shorter transfer electrodes 55, 57, 59, the n⁻⁻ diffusion layers 84 just beneath the longer transfer electrodes 56, 58, 60, and the n⁻ diffusion layers 85 formed just beneath the transfer electrodes 56, 58, 60. The length of the channels (the length in the lateral direction on the sheet of paper) is nearly equal.

The impurity concentration of the n⁻ diffusion layers 85 is higher than the impurity concentration of the n⁻⁻ diffusion layers 84.

In this embodiment, the ratio of the impurity of the n⁻ diffusion layers 85 and the n⁻⁻ diffusion layers 84 is set to be about 1.4 times. This value is set so that the potential difference of the channel from the n diffusion layer 83 may be about ⅔ times of the driving pulse voltage when depleted.

In this constitution, as shown in the first embodiment, when the n⁻⁻ diffusion layers 84 and the n⁻ diffusion layer 85 (used as the buried channel regions), and the n diffusion layer 83 formed in the semiconductor substrate 51 are depleted, the potentials of the channels formed in the n⁻⁻ diffusion 84, n⁻ diffusion layers 85, and n⁻ diffusion layer 83 are higher in the n⁻⁻ diffusion layers 84 than in the n diffusion layer 83, are higher in the n⁻ diffusion layers 85 than in the n diffusion layer 83, and are higher in the n⁻ diffusion layers 85 than in the n⁻⁻ diffusion layers 84.

To quicken the transfer speed of the charge transfer device, the speed of transferring the charge in the potential well beneath a certain transfer electrode to the potential well in the adjacent transfer electrode must be increased. Attempts to quicken this transfer speed are limited by diffusion and fringe electric field.

Generally, when transferring the whole charge by diffusion alone, the charge's transfer time is proportional to the square of the gate length of the transfer electrode. Similarly when transferring all charge by fringe electric field alone, the transfer time of all charges is proportional to the third power of the gate length. Therefore, to shorten the time required for transfer, the gate length should be shortened. In this embodiment, the effective gate length has been cut short to about ⅔ times of the prior art by determining the spatial position so that the position of the right end of the n⁻ diffusion layers 85 may coincide with that of the right end of the longer transfer electrodes 56, 58, 60, and that the position of the left end of the n⁻⁻ diffusion layers 84 may coincide with that of the left end of the longer transfer electrodes 56, 58, 60.

Thus, as compared with the prior art, the gate length is ⅔ times, so that the transfer speed is about two times faster.

In this embodiment, the length of the longer transfer electrodes 56, 58, 60 is formed to about twice the length of the shorter transfer electrodes 55, 57, 59, and the length of the n⁻ diffusion layers 85 (in the lateral direction of the sheet of paper) is formed to about half the length of the transfer electrodes 56, 58, 60. The position of the right end of the n⁻ diffusion layers 85 nearly coincides with that of the right end of the transfer electrodes 56, 58, 60 formed on the gate oxide film in the spatial position. The length of the n⁻⁻ diffusion layers 84 (in the lateral direction on the sheet of paper) is formed to about half the length of the transfer electrodes 56, 58, 60. The position of the left end of the n⁻⁻ diffusion layers 84 coincides nearly with that of the left end of the transfer electrodes 56, 58, 60 formed on the gate oxide film 54 in the spatial position. The charge transfer device having such features has been explained herein.

At this time, the length of the n⁻⁻ diffusion layers 84 formed just beneath the transfer electrodes 55, 56, 57, 58, 59, 60 is desirably L1, the length of the n⁻ diffusion layers 85 adjacent thereto is desirably L2, and the length of the n diffusion layer 83 adjacent to the other end of the n⁻ diffusion layers 85 is desirably L3. It is here assumed that L1+L2+L3=L0.

The charge transfer time T is expressed as $T = K \times (L1^3 + L2^2 + L3^3)$, where K is a constant.

In the two-phase driven charge transfer device of the prior art, since L2=0, L1=L3=L0/2, the charge transfer time T0 is $T0 = L0^3 \times K/4$.

First, when the length of the transfer electrodes is fixed, as shown in the third embodiment, the value of n satisfying the inequality T1<T0 is determined.

As a result, n is in a range of $0.07 \leq n \leq 0.6$.

Hence we obtain $0.1 \leq [1/(2L0/3)] \leq 0.9$.

Accordingly, when the length of the longer transfer electrodes 56, 58, 60 is twice that of the shorter transfer electrodes 55, 57, 59, if the length of the n⁻⁻ diffusion layers 84 is in a range of 10% to 90% of the longer transfer electrodes 56, 58, 60, the charge transfer time may be shorter than the prior art.

When the length of the transfer electrodes is variable, charge transfer time may be explained as in the third embodiment. That is, we obtain $0.61 \, (L1+L2)/L3$.

Hence, if the length of the n⁻⁻ diffusion layers 84 just beneath the longer transfer electrodes 56, 58, 60 is equal to that of the n⁻ diffusion layers 85, as far as the length of the longer transfer electrodes 56, 58, 60 is 0.61 times or more the length of the shorter transfer electrodes 55, 57, 59, the transfer time may be shorter than in the conventional charge transfer device.

In addition, the position of the left end of the n⁻⁻ diffusion layers 84 nearly coincides with that of the left end of the transfer electrodes 56, 58, 60 formed on the gate oxide film in the spatial position, but when the position of the left end of the n⁻⁻ diffusion layers 84 is located at the left side of that of the left end of the transfer electrodes 56, 58, 60, as in the first embodiment, it does not matter if deviations occur up to the position of the right end of the adjacent transfer electrodes 55, 57, 59. If further deviations to the left occur, part of the charges may be left over during the transferring process.

Moreover, the position of the right end of the n⁻ diffusion layers 85 nearly coincides with that of the right end of the transfer electrodes 56, 58, 60 formed on the gate oxide film in the spatial position, but when the position of the right end of the n⁻ diffusion layers 85 is deviated to the right side of the right end of the transfer electrodes 56, 58, 60, it does not matter if deviations occur up to the position at the left end of the adjacent transfer electrodes 57, 59. But if further deviations to the right occur, the charges may be left over during the transferring process.

The individual transfer electrodes 55 to 60 are protected with an insulation film 61 made of $SiO_2$. The transfer electrodes 55 to 60 are connected to the driving voltage application terminals 81, 82. The specified two voltages are applied to the terminals 81, 82.

In this embodiment, the voltages applied to the terminals 81, 82 are respectively called $\phi 1$, $\phi 2$.

The transfer electrode 57 and transfer electrode 56 are connected to the terminal 81, and applied with voltage $\phi 1$. The transfer electrode 59 and transfer electrode 58 are connected to the terminal 82, and applied with voltage $\phi 2$.

Thus, the units of wirings of the shorter transfer electrodes 57, 59 and longer transfer electrodes 56, 58, are alternately connected to the terminals 81, 82 as shown in FIG. 10.

In such a charge transfer device, what is different from the first embodiment is that the n⁻⁻ diffusion layers 84 and the n⁻ diffusion layers 85 are formed in the n diffusion layer 83 and just beneath the longer transfer electrodes 56, 58, 60. The impurity concentration of the n⁻⁻ diffusion layers 84 is higher than the impurity concentration of the n diffusion layer 83, and the impurity concentration of the n⁻ diffusion layers 85 is higher than that of the n⁻⁻ diffusion layers 84. By thus defining layer 83, 84 and 85, if the n diffusion layer 83, n⁻⁻ diffusion layers 84 and n⁻ diffusion layers 85 which are used as the buried channel type charge transfer device are set in a depletion state, the height of the channel potentials are on the order of the n⁻ diffusion layers 85, n⁻⁻ diffusion layers 84, and n diffusion layer 83.

Figure 11:
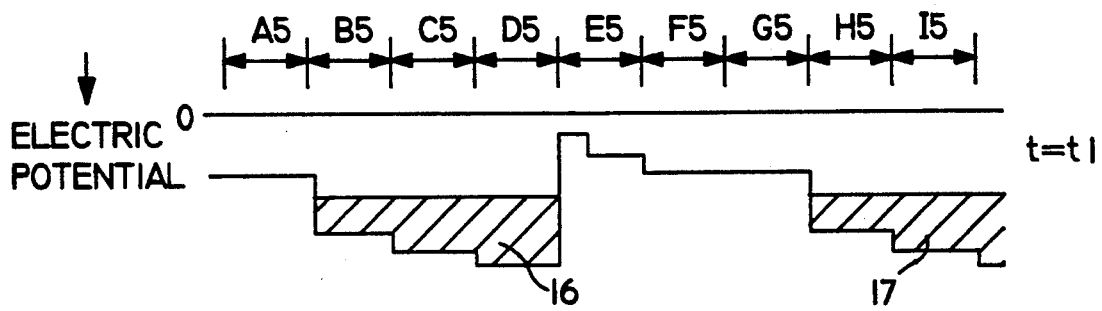
FIG. 11 is a diagram showing the mode of charges of a charge transfer device in the fourth embodiment of the invention.

FIG. 11 shows the potential distribution of the channel at time t1 shown in FIG. 8. Numerals 16, 17 are charges. The regions A5 to I5 correspond to the regions A5 to I5 of the transfer electrodes shown in FIG. 10.

In the initial state, $\phi 1$ is L, and $\phi 2$ is H. In this state, channels are formed on the surface of the semiconductor substrate 51 just beneath the transfer electrodes 55, 58, 59. In these portions, a potential well is formed, and charges may be stored. The transfer electrodes 56, 57, 60 are at L voltage, so that channels are not formed. Thus, in the initial state, the charge is ready to be stored in the channels just beneath the transfer electrodes 55, 58, 59.

Next, the voltages of $\phi 1$ and $\phi 2$ are simultaneously inverted in phase. That is, the voltage of $\phi 1$ changes from L to H, and the voltage of $\phi 2$ changes from H to L at the same time. By this change, channels are formed just beneath the transfer electrodes 56, 57, 60. The time in such state is indicated as $t=t1$.

The voltage of $\phi 1$ has a reverse phase to the voltage of $\phi 2$. Accordingly, the charges stored in the regions B5, C5, D5 become low in the potential in the regions B5, C5, D5, while these charges become high in the potential in the adjacent regions E5, F5, G5, when the voltages of $\phi 1$ and $\phi 2$ are inverted in phase so that L in $\phi 1$ and H in $\phi 2$. Accordingly, the charges 16 move from the regions B5, C5, D5 to the regions E5, F5, G5. At this time, the charges 17 stored in the regions H5, I5 is also moving in the rightward direction in FIG. 11.

Generally, in the buried channel type charge transfer device, the charge transfer achieved by fringe electric field is more dominant than if achieved by diffusion, and hence the required transfer time is nearly proportional to the third power of the gate length.

As compared with the prior art, in the charge transfer device of this embodiment, the effective gate length is about ⅔ times, so that the transfer time will be notably shortened.

Taking note of, however, the longer transfer electrodes 56, 58, 60, it is necessary to transfer the distance of two gates at once, and the transfer time is shortened to about 44% of the prior art.

A manufacturing method of a charge transfer device in a fifth embodiment of the invention is explained below while referring to FIG. 12(a)–(d). FIG. 12(a)–(d) shows the method of manufacturing the charge transfer device shown in the first embodiment.

Figure 12:
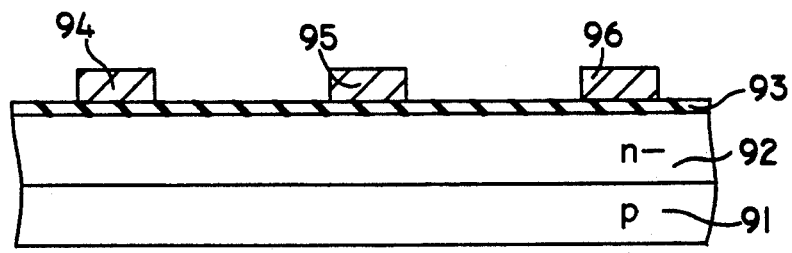
Figure 12:
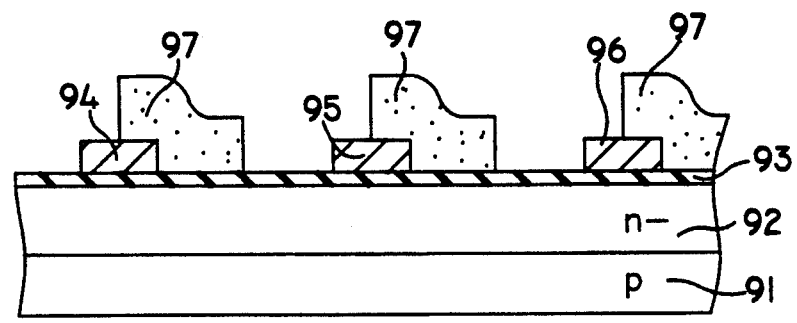
Figure 12:
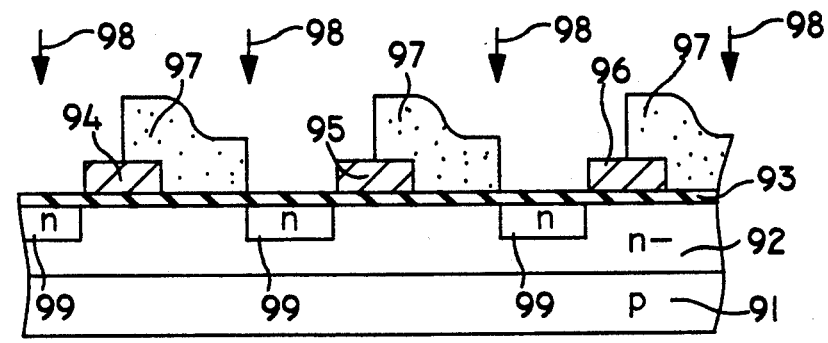
Figure 12:
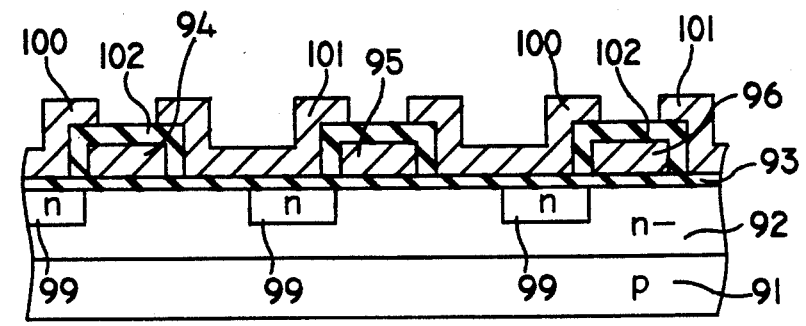

FIG. 12 (a) relates to a state of forming a first layer of transfer electrode.

In the first place, n-type impurity ions are implanted on the whole surface of the principal plane of a semiconductor substrate 91 of p-type silicon wafer. Then, by heat treatment at high temperature, an n⁻ diffusion layer 92 is formed.

On the n⁻ diffusion layer 92, an oxide film 93 is formed by Chemical Vapor Deposition (CVD) and heat treatment processes. On the oxide film 93, a polycrystalline silicon film is formed by forming shorter transfer electrodes 94, 95, 96.

Afterwards, by ordinary photolithography, resist patterns are formed in the regions for forming shorter transfer electrodes 94, 95, 96. Using the resist patterns as the mask, dry etching is performed until the oxide film 93 is exposed. Thus, the shorter transfer electrodes 94, 95, 96 are formed.

A resist pattern 97 is then formed by ordinary photolithography (FIG. 12 (b)).

The resist pattern 97 is used as the mask for ion implantation in a later process. Accordingly, the resist pattern is formed so that at least one end of the resist pattern 97 overlaps with a part of the shorter transfer electrodes 94, 95, 96. The other end of the resist pattern 97 determines the position of one end of the diffusion layer formed beneath the longer transfer electrode. The other end of the diffusion layer is determined by the position of one exposed end of the adjacent shorter transfer electrode (for example, 96). Thus, one end of the diffusion layer is formed in a region between an end of the resist pattern 97 and an end of the adjacent transfer electrode (e.g. 96). In this region, the oxide film 93 is exposed as shown in FIG. 12 (b).

Next, as shown in FIG. 12 (c), using the resist pattern 97 and the shorter transfer electrodes 94, 95, 96 as the masks, phosphorus or arsenic ions are implanted.

Consequently, after removing the resist pattern 97, by heat treatment, n diffusion layers 99 are formed. The width of the n diffusion layer 99 may not be controlled precisely, and layer 99 may be about half of the channel beneath the longer transfer electrodes to be formed in a later process.

A position of one edge of the ion implantation region is determined by that of the shorter transfer electrodes, while the position of the other edge may not be very precise, so that mask alignment will be easy in the lithography process.

Afterwards, the resist pattern 97 is removed. Next, in an oxidizing atmosphere, the semiconductor substrate 91 is heat-treated. By this treatment, an oxide film 102 is formed on the surface of the shorter transfer electrodes 94, 95, 96.

Successively, a polycrystalline silicon film is formed on the entire surface of the principal plane of the semiconductor substrate 91.

By ordinary photolithography, afterwards, a resist pattern (not shown) is formed in the region for forming longer transfer electrodes 100, 101. Using the resist pattern as the mask, dry etching is performed until the oxide film 102 is exposed. In this way, the longer transfer electrodes 100, 101 are formed (FIG. 12(d)).

Referring now to FIG. 13(a)–(d), a sixth embodiment of the invention relating to a method of manufacturing a charge transfer device is explained below. FIG. 13(a)–(d) relates to a method of manufacturing the charge transfer device shown in the second embodiment.

Figure 13:
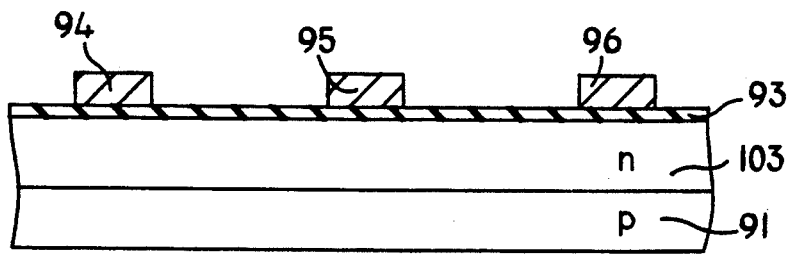
Figure 13:
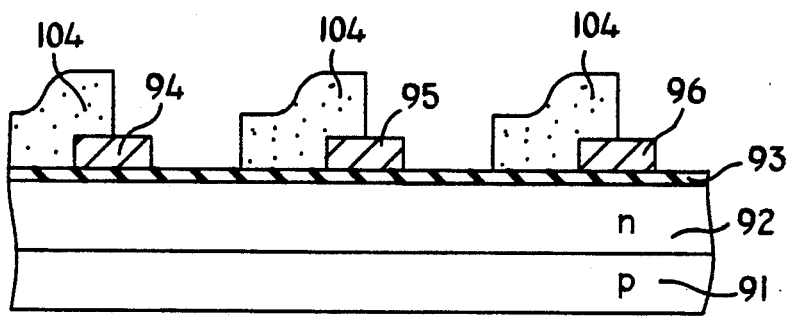
Figure 13:
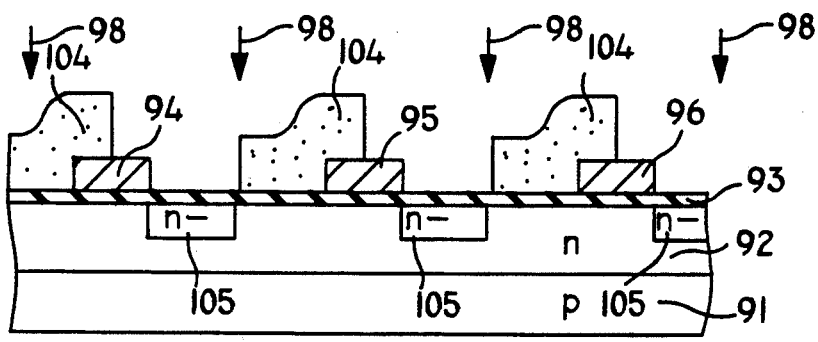
Figure 13:
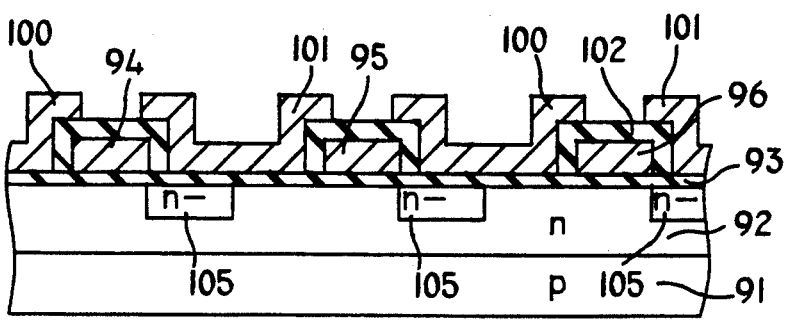

FIG. 13 (a) shows the state of forming a first layer of a transfer electrode.

First, n-type impurity ions are implanted on the whole surface of the principal plane of a semiconductor substrate 91 of a p-type silicon wafer. Then, by heat treatment at high temperature, an n diffusion layer 103 is formed.

On the n diffusion layer 103, an oxide film 93 is formed by the thermal CVD process. On the oxide film 93, a polycrystalline silicon film is formed for forming shorter transfer electrodes 94, 95, 96.

Later, by ordinary photolithography, a resist pattern (not shown) is formed in a region for forming shorter transfer electrodes 94, 95, 96. Using the resist pattern as the mask, dry etching is performed until the oxide film 93 is exposed. In this way, the shorter transfer electrodes 94, 95, 96 are formed as shown in FIG. 13 (a).

By subsequent photolithography, a resist pattern 104 is formed (FIG. 13 (b)).

A resist pattern 104 is used as the mask for ion implantation in a later process. Accordingly, pattern 104 is formed so that at least one end of the resist pattern 104 overlaps with a part of the transfer electrodes 94, 95, 96. The other end of the resist pattern 104 determines the position at one end of the diffusion layer formed beneath the longer transfer electrode. The other end of the diffusion layer is determined at the position of one exposed end of the adjacent shorter transfer electrode (for example 94). Thus, one end of the diffusion layer is formed in a region between an end of the resist pattern 104 and an end of the adjacent transfer electrode (i.e. 94). In this region, the oxide film 93 is exposed as shown in FIG. 13 (D).

Next, as shown in FIG. 13 (c), using the resist pattern 104 and the shorter transfer electrodes 94, 95, 96 as the masks, boron ions are implanted.

After removing the resist pattern 104, heat treatment is performed, and $n^-$ diffusion layers 105 are formed. The width of the $n^-$ diffusion layer 105 may not be controlled precisely, and may be about half the channel beneath the longer transfer electrodes to be formed in a later process.

A position of one edge of the ion implantation region is determined by that of the shorter transfer electrode, while the position of the other edge of the ion implantation region is not required to be high in precision. Thus, mask alignment will be easy in a lithographic process.

Later, the resist pattern 104 is removed. Next, the semiconductor substrate 91 is heat-treated in an oxidizing atmosphere. By this treatment, an oxide film 102 is formed on the surface of the shorter transfer electrodes 94, 95, 96.

Successively, a polycrystalline silicon film is formed on the whole surface of the principal plane of the semiconductor substrate 91.

By subsequent ordinary photolithography, a resist pattern (not shown) is formed in a region for forming longer transfer electrodes 100, 101. Using the resist pattern as the mask, dry etching is performed until the oxide film 102 is exposed. Thus, longer transfer electrodes 100, 101 are formed (FIG. 13 (d)).

In this embodiment, thus, for the same reason as in the fifth embodiment for the manufacturing method, mask alignment is easy.

Relating to a method of manufacturing the charge transfer device of the invention, a seventh embodiment is explained by referring to FIG. 14(a)–(e). FIG. 14(a)–(e) relates to a manufacturing method of the charge transfer device shown in the third embodiment.

Figure 14:
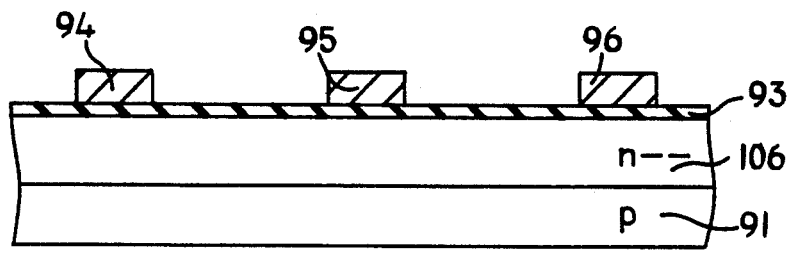
Figure 14:
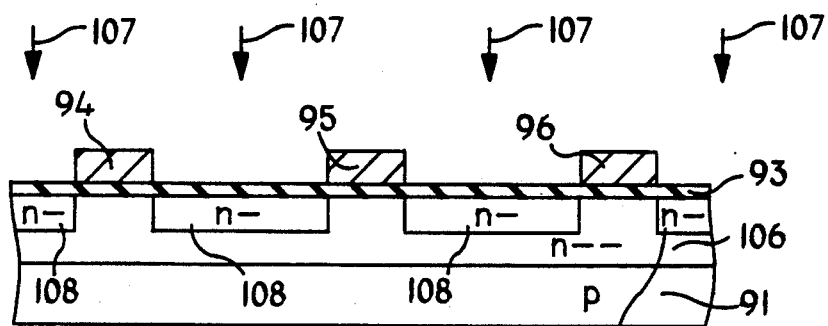
Figure 14:
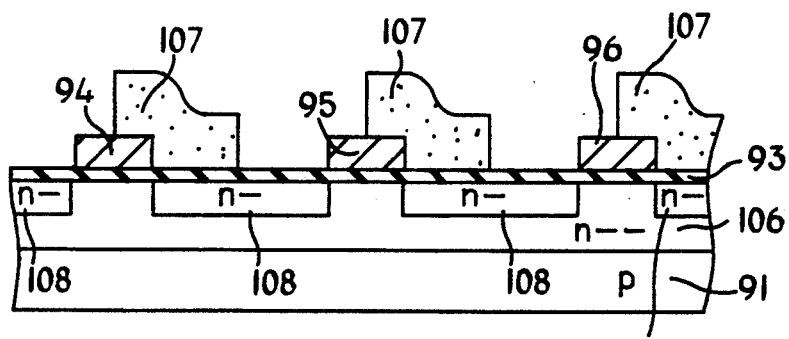
Figure 14D:
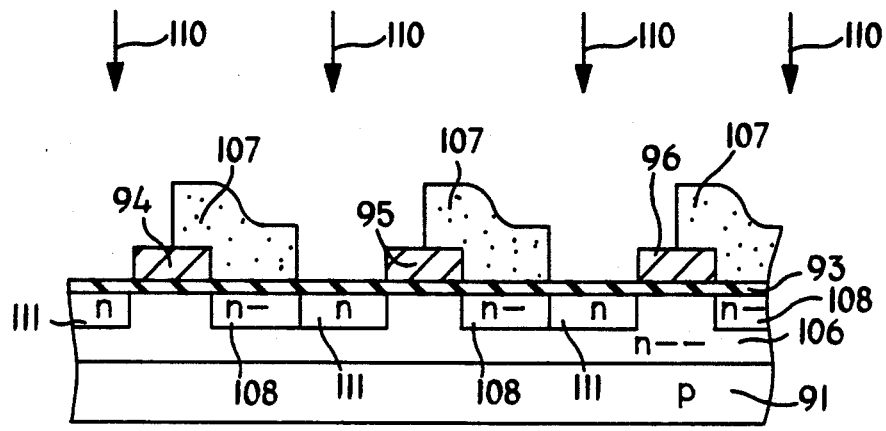
Figure 14E:
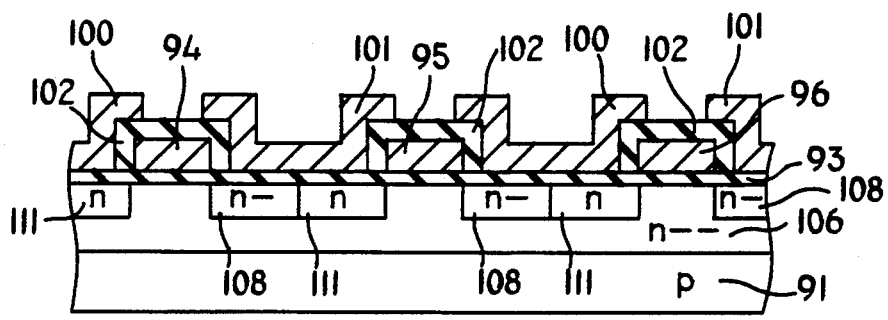
Figure 15:
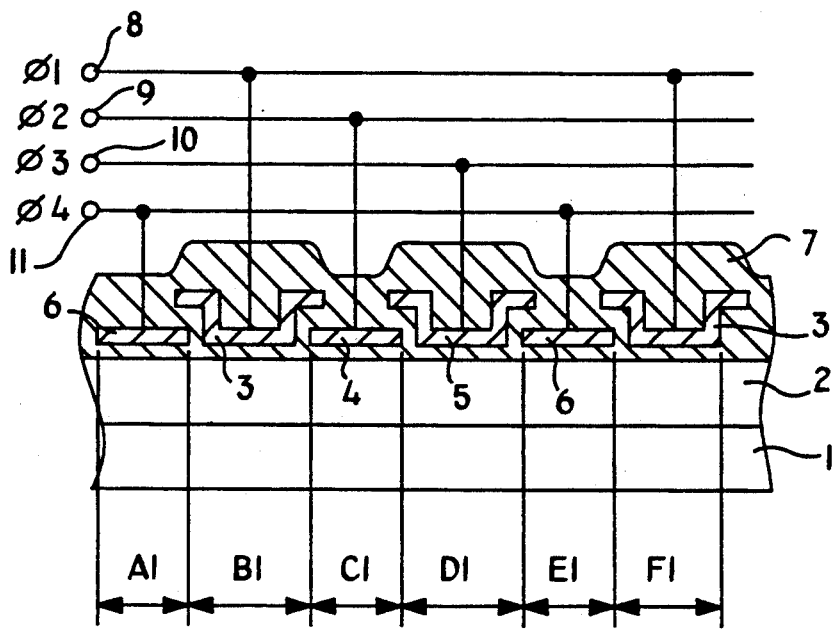
FIG. 15 is a sectional view for explaining a conventional charge transfer device.
Figure 16:
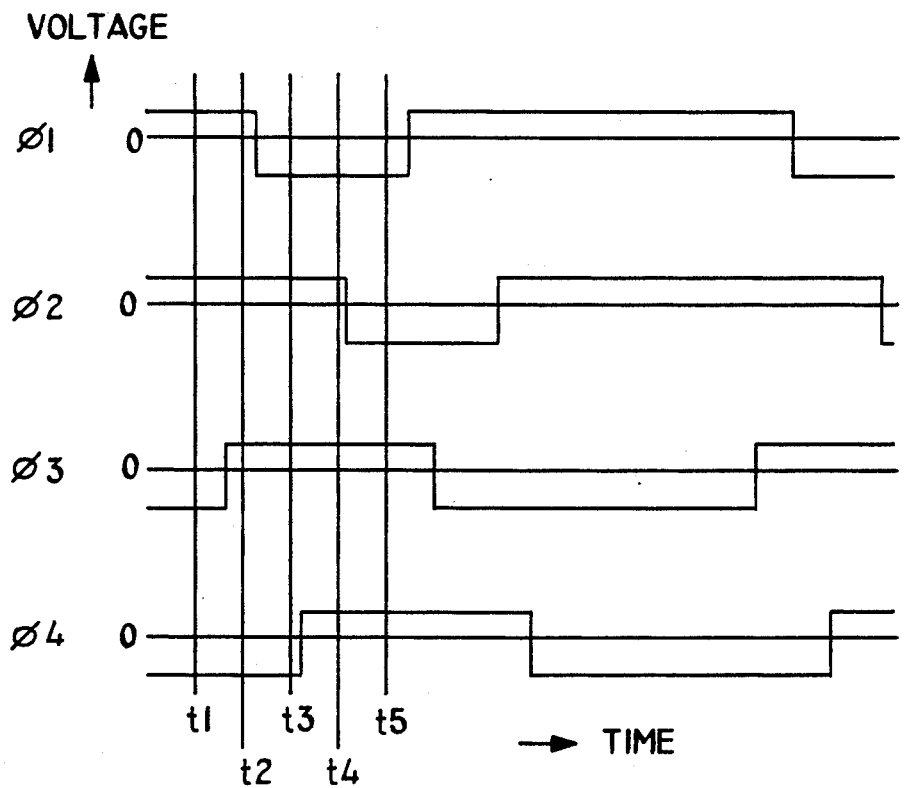
FIG. 16 is a diagram showing the state of applied voltage of the conventional charge transfer device.
Figure 17:
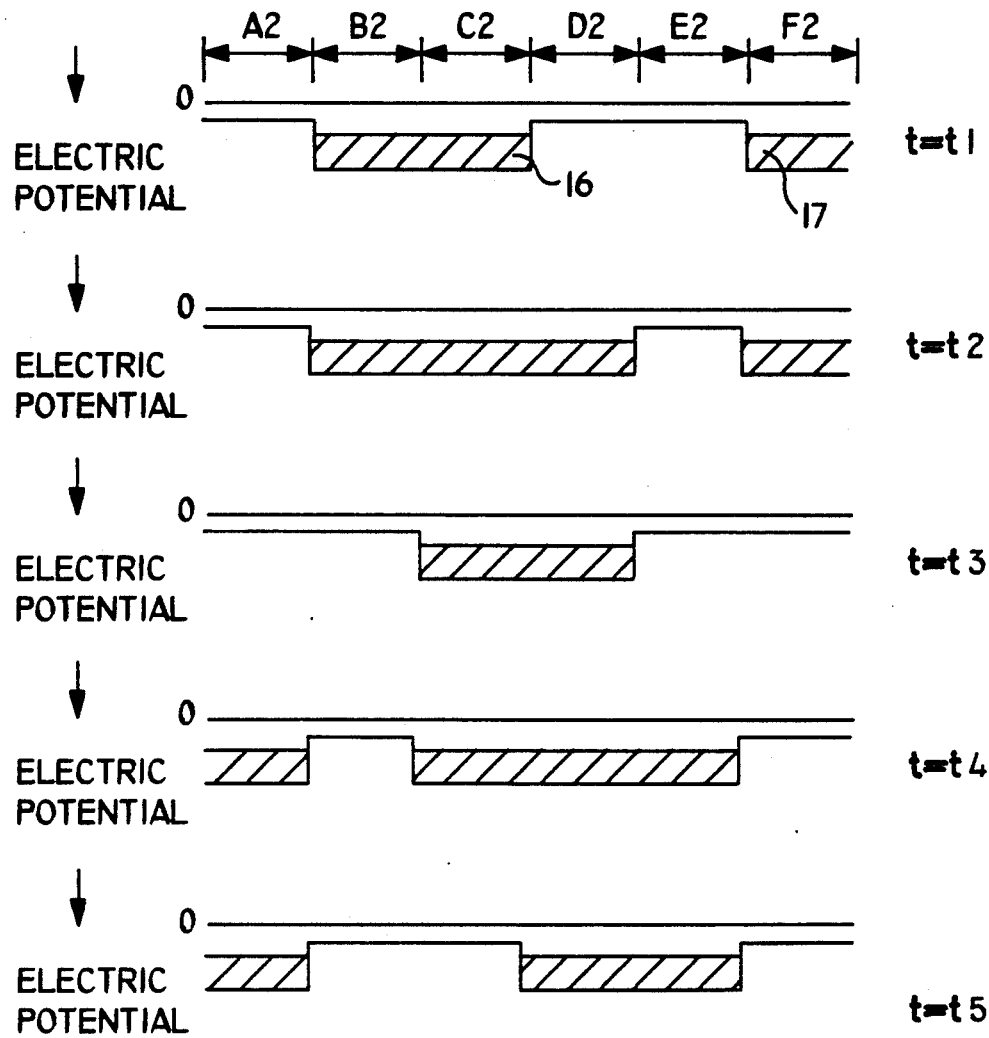
FIG. 17 is a diagram showing the mode of charges of the conventional charge transfer device.
Figure 18:
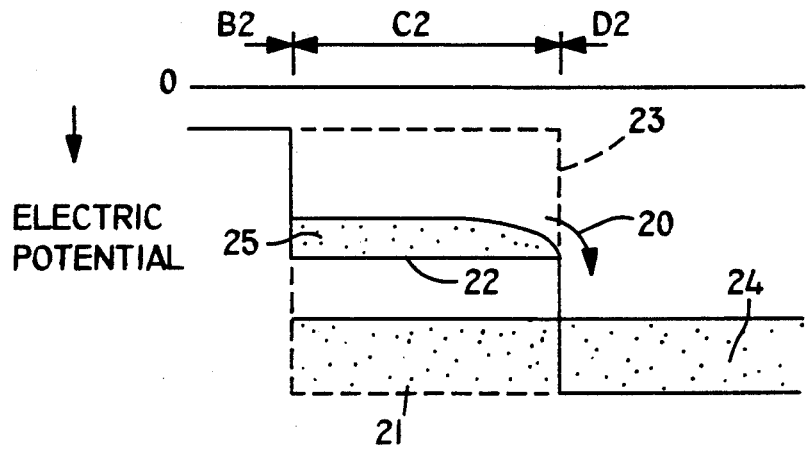
FIG. 18 is a diagram showing a detailed mode of charges of the conventional charge transfer device.

FIG. 14 (a) shows the state of forming a first layer of transfer electrode.

In the first step, n-type impurity ions are implanted on the entire surface of the principal plane of a semiconductor substrate 91 of a p-type silicon wafer. Later, by heat treatment at high temperature, $n^{--}$ diffusion layer 106 is formed.

On the $n^{--}$ diffusion layer 106, an oxide film 93 is formed by a thermal CVD process. On the oxide film 93, a polycrystalline silicon film is formed for forming shorter transfer electrodes 94, 95, 96.

Afterwards, by an ordinary photolithography process, a resist pattern (not shown) is formed in a region for forming shorter transfer electrodes 94, 95, 96. Using this resist pattern as the mask, dry etching is performed until the oxide film 93 is exposed. In this way, the shorter transfer electrodes 94, 95, 96 are formed.

Using the shorter transfer electrodes 94, 95, 96 as the mask, ions are implanted. Then, by heat treatment, n⁻ diffusion layers 108 are formed. The n⁻ diffusion layer 108 is formed by self-alignment of ion implantation. Accordingly, the width of the n⁻ diffusion layer 108 is set in the distance between a specific transfer electrode 94 and its adjacent shorter transfer electrode 95, or in the distance between the transfer electrode 94 and transfer electrode 96 (FIG. 14 (b)).

By ordinary photolithography, a resist pattern 107 is formed (FIG. 14 (c)).

This resist pattern 107 is used as the mask for ion implantation in a later process. It is accordingly formed so that at least the position of one end of the resist pattern 107 may overlap with that of a part of the transfer electrode 95. The other end of the resist pattern 107 determines the position of one end of the diffusion layer formed beneath the longer transfer electrode. The other end of this diffusion layer is determined by the position of one exposed end of the adjacent shorter transfer electrode (for example 94). Thus, the position of one end of the diffusion layer is formed in a region between the position of an end of the resist pattern 107 and that of an end of the adjacent transfer electrode (i.e. 94). In this region, the oxide form 93 is exposed as shown in FIG. 14 (c).

Next, as shown in FIG. 14 (d), using the resist patterns 107 and shorter transfer electrodes 94, 95, 96 as the masks, phosphorus or arsenic ions are implanted.

After removing the resist patterns 107, by heat treatment, n diffusion layers 111 are formed. The width of each of the n diffusion layers 111 is not required to be controlled precisely, but may be about half the channel beneath the longer transfer electrode to be formed in a later process.

One edge of the ion implantation region is determined by the shorter transfer electrode, while the other edge need not be of precise dimension. Thus, mask alignment in the lithography process may be easily accomplished.

Later, the resist patterns 107 are removed. Sequentially, the semiconductor substrate 91 is heat-treated in an oxidizing atmosphere. By this treatment, oxide films 102 are formed on the surface of the shorter transfer electrodes 94, 95, 96.

A polycrystalline silicon film is formed on the entire surface of the principal plane of the semiconductor substrate 91.

Afterwards, by ordinary photolithography, a resist pattern (not shown) is formed in the region for forming longer transfer electrodes 100, 101. Using the resist pattern as the mask, dry etching is performed until the oxide film 102 is exposed. In this way, longer transfer electrodes 100, 101 are formed (FIG. 14 (e)).

In this embodiment, thus, in the same reason as in the manufacturing methods in the fifth and sixth embodiments, mask alignment is easy.

That is, as the buried type channels, n⁻⁻ diffusion layer 106, n⁻ diffusion layers 108 and n diffusion layers 111 beneath a longer transfer electrode are formed as shown in FIG. 14 (e).

Meanwhile, the structure shown in the fourth embodiment may be similarly obtained as in the third method of manufacturing, by setting the resist pattern forming position the same as in the second method of manufacturing, and by implanting boron ions.

What is claimed:

1. A charge transfer device, comprising:
a semiconductor substrate of a certain conductivity type,
a first diffusion layer of a reverse conductivity type formed on said semiconductor substrate,
a second diffusion layer of the reverse conductivity type formed in said first diffusion layer,
an insulation film formed above said semiconductor substrate, and
first and second transfer electrodes formed on said insulating film, wherein the length of said first transfer electrode is longer than the length of said second transfer electrode,
wherein at least one of said first transfer electrodes is formed above said second diffusion layer, and said first diffusion layer is formed below one of said second transfer electrodes,
the ratio of said first transfer electrode and said second transfer electrode in width is between 1.6 and 4.0, and
the charge transfer device is four phase driven,
wherein the impurity concentration of said second diffusion layer is higher than the impurity concentration of said first diffusion layer.

2. A charge transfer device, comprising:
a semiconductor substrate of a certain conductivity type,
a first diffusion layer of a reverse conductivity type formed on said semiconductor substrate,
a second diffusion layer of the reverse conductivity type formed in said first diffusion layer,
an insulation film formed above said semiconductor substrate, and
first and second transfer electrodes formed on said insulating film, wherein the length of said first transfer electrode is longer than the length of said second transfer electrode,
wherein at least one of said first transfer electrodes is formed above said second diffusion layer, and said first diffusion layer is formed below one of said second transfer electrodes,
the ratio of said first transfer electrode and said second transfer electrode in width is between 1.6 and 4.0, and
the charge transfer device is four phase driven,
wherein the ratio of impurity concentration of said first diffusion layer and second diffusion layer is about 1.3 times.

3. A charge transfer device, comprising:
a semiconductor substrate of a certain conductivity type,
a first diffusion layer of a reverse conductivity type formed on said semiconductor substrate,
a second diffusion layer of the reverse conductivity type formed in said first diffusion layer,
an insulation film formed above said semiconductor substrate, and
first and second transfer electrodes formed on said insulation film, wherein the length of said first transfer electrode is longer than the length of said second transfer electrode,
wherein at least one of said first transfer electrodes is formed above said second diffusion layer, and said first diffusion layer is formed below one of said second transfer electrodes,
the ratio of said first transfer electrode and said second transfer electrode in width is between 1.6 and 4.0, and the charge transfer device is four phase driven, wherein the channel potential formed on the surface of said semiconductor substrate is higher in said first diffusion layer than in said second diffusion layer.

4. A charge transfer device, comprising:

a semiconductor substrate of a certain conductivity type, a first diffusion layer of a reverse conductivity type formed on said semiconductor substrate, a second diffusion layer of the reverse conductivity type formed in said first diffusion layer, an insulation film formed above said semiconductor substrate, and first and second transfer electrodes formed on said insulation film, wherein the length of said first transfer electrode is longer than the length of said second transfer electrode, wherein at least one of said first transfer electrodes is formed above said second diffusion layer, and said first diffusion layer is formed below one of said second transfer electrodes, the ratio of said first transfer electrode and said second transfer electrode in width is between 1.6 and 4.0, and the charge transfer device is four phase driven, wherein the channel potential in the depletion state of said first and second diffusion layers is higher by about half of the driving pulse voltage in said second diffusion layer than the potential of said first diffusion layer.

5. A charge transfer device comprising:

a semiconductor substrate of one conductivity type, a first diffusion layer of a reverse conductivity type formed on said semiconductor substrate, a second diffusion layer of the reverse conductivity type formed in said first diffusion layer, a third diffusion layer of the reverse conductivity type formed adjacent to said second diffusion layer and in said first diffusion layer, an insulation film formed above said semiconductor substrate, and first and second transfer electrodes formed on said insulation film, wherein the length of said first transfer electrode is longer than the length of said second transfer electrode, wherein said first transfer electrode is formed at least above both of said second diffusion layer and third diffusion layer, and the impurity concentration of said first diffusion layer is higher than the impurity concentration of said second diffusion layer and said third diffusion layer.

6. A charge transfer device according to claim 5, wherein the depth of said second diffusion layer is approximately equal to the depth of said third diffusion layer.

* * * * *

UNITED STATES PATENT AND TRADEMARK OFFICE
CERTIFICATE OF CORRECTION

PATENT NO.    : 5,315,137
DATED         : May 24, 1994
INVENTOR(S)   : Masaji Asaumi et al.

It is certified that error appears in the above-identified patent and that said Letters Patent is hereby corrected as shown below:

Column 28, line 11, "insulating" should be "insulation".

Column 28, line 35, "insulating" should be "insulation".

Signed and Sealed this

Eleventh Day of October, 1994

Attest:

BRUCE LEHMAN

Attesting Officer

Commissioner of Patents and Trademarks